(12) United States Patent
Ohshima et al.

(10) Patent No.: US 12,426,430 B2
(45) Date of Patent: Sep. 23, 2025

(54) DISPLAY DEVICE THAT IMPROVES LIGHT EXTRACTION EFFICIENCY FROM LIGHT EMITTING ELEMENT BY FUNCTIONING AS A MIRROR

(71) Applicant: SHARP KABUSHIKI KAISHA, Osaka (JP)

(72) Inventors: Akira Ohshima, Sakai (JP); Yasushi Asaoka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 416 days.

(21) Appl. No.: 18/024,008

(22) PCT Filed: Sep. 4, 2020

(86) PCT No.: PCT/JP2020/033605
§ 371 (c)(1),
(2) Date: Feb. 28, 2023

(87) PCT Pub. No.: WO2022/049723
PCT Pub. Date: Mar. 10, 2022

(65) Prior Publication Data
US 2023/0352517 A1    Nov. 2, 2023

(51) Int. Cl.
*H01L 27/15* (2006.01)
*H10H 29/14* (2025.01)

(52) U.S. Cl.
CPC .................................. *H10H 29/142* (2025.01)

(58) Field of Classification Search
CPC .. H10H 29/142; H10H 20/856; H10H 20/833; H10H 20/841; H01L 25/0756; H01L 25/0753; H10K 59/32; H10K 2102/10; H10K 2102/3035; H10K 59/122; H10K 59/878; H10K 59/879; G09F 9/30; G09F 9/46; H04N 5/66
See application file for complete search history.

(56) References Cited

U.S. PATENT DOCUMENTS

| | | | | |
|---|---|---|---|---|
| 2015/0123952 | A1* | 5/2015 | Kim | H10K 50/818 345/82 |
| 2019/0067394 | A1* | 2/2019 | Cheon | H10K 50/856 |
| 2023/0091271 | A1* | 3/2023 | Ohshima | H10K 59/122 257/91 |
| 2023/0105196 | A1* | 4/2023 | Ohshima | H10H 20/812 257/89 |

FOREIGN PATENT DOCUMENTS

JP    2016166917 A    9/2016

* cited by examiner

*Primary Examiner* — Tracie Y Green
(74) *Attorney, Agent, or Firm* — ScienBiziP, P.C.

(57) ABSTRACT

A display device includes a substrate, and a light-emitting element provided on the substrate and including a light-emitting portion, a first reflective layer overlapping with the light-emitting portion and reflecting external light, and a light-exiting portion adjacent to the light-emitting portion. The light-emitting portion includes a first electrode, a first light-emitting layer, and a second electrode that are provided in this order from the substrate side to the first reflective layer side, and the light-exiting portion includes a first opening that is an opening of the first reflective layer and a second reflective layer reflecting light from the light-emitting portion to the first opening.

17 Claims, 25 Drawing Sheets

DISPLAY DEVICE THAT IMPROVES LIGHT EXTRACTION EFFICIENCY FROM LIGHT EMITTING ELEMENT BY FUNCTIONING AS A MIRROR

TECHNICAL FIELD

The disclosure relates to a display device.

BACKGROUND ART

A mirror display described in PTL 1 includes a reflective layer that overlaps with a display surface of an image of a display portion and has a plurality of microscopic windows formed therein, and a lens array portion that is provided between the display surface and the reflective layer and condenses light from the display portion onto each microscopic window. In the mirror display described in PTL 1, the surface of the reflective layer is a mirror surface, and so the mirror display functions as a mirror, and the light from the display portion is transmitted through the lens array portion and the plurality of microscopic windows formed in the reflective layer, and so the mirror display also functions as a display.

CITATION LIST

Patent Literature

PTL 1: JP 2016-166917 A

SUMMARY

Technical Problem

In the mirror display described in PTL 1, the light from the display portion is condensed onto each microscopic window by being transmitted through the lens array portion. Thus, in the mirror display described in PTL 1, since the light from the display portion is transmitted through the lens array portion, the light emitted from each microscopic window formed in the reflective layer is reduced in brightness. An aspect of the disclosure aims to provide a display device that improves an extraction efficiency of light from a light-emitting element and also functions as a mirror.

Solution to Problem

A display device according to an aspect of the disclosure includes a substrate, and a light-emitting element provided on the substrate and including a light-emitting portion, a first reflective layer overlapping with the light-emitting portion and configured to reflect external light, and a light-exiting portion adjacent to the light-emitting portion. The light-emitting portion includes a first electrode, a first light-emitting layer, and a second electrode provided in this order from the substrate side to the first reflective layer side, and the light-exiting portion includes a first opening, the first opening being an opening of the first reflective layer, and a second reflective layer configured to reflect light from the light-emitting portion to the first opening.

Advantageous Effects of Disclosure

According to an aspect of the disclosure, it is possible to provide a display device that improves an extraction efficiency of light from a light-emitting element and also functions as a mirror.

DESCRIPTION OF EMBODIMENTS

Figure 1:
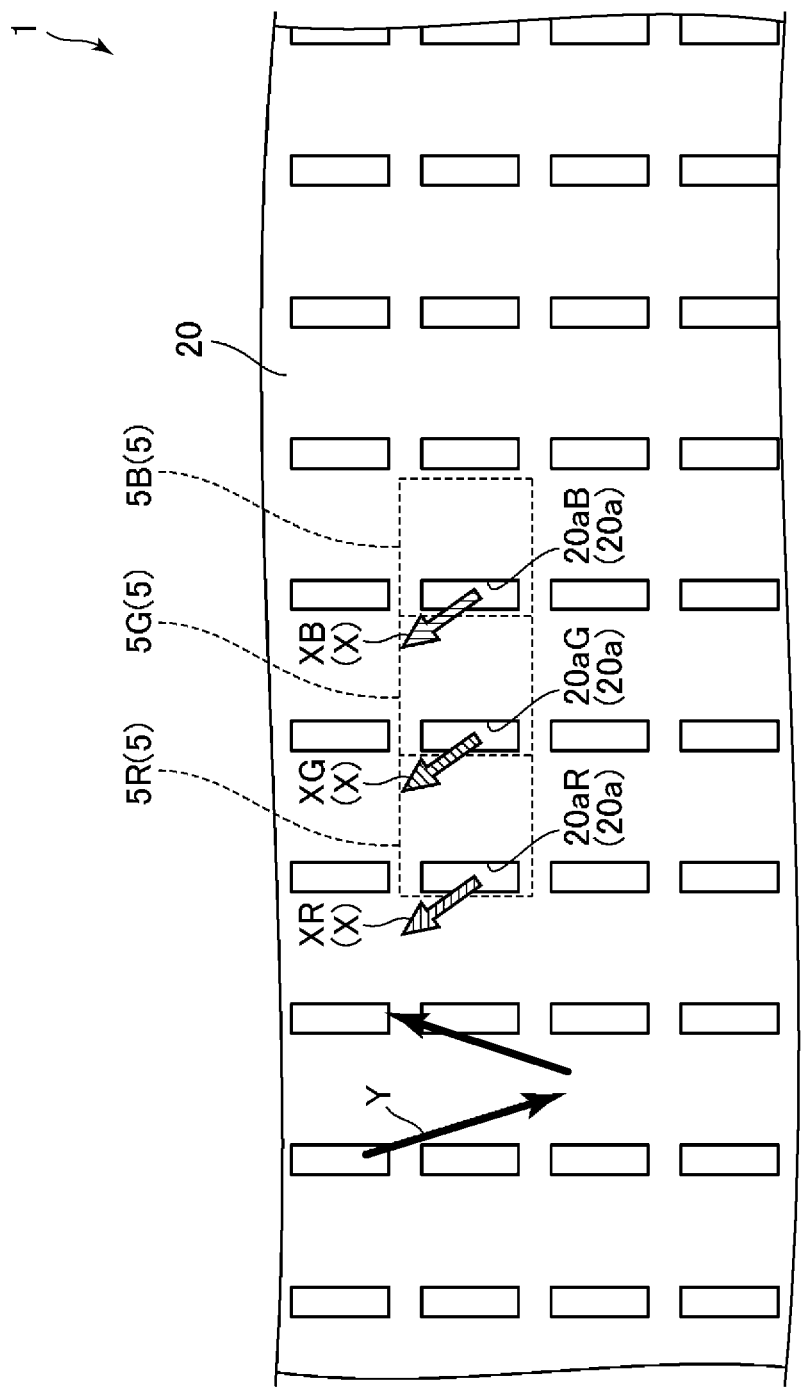
FIG. 1 is a plan view illustrating an example of a configuration of a display device according to a first embodiment.

Hereinafter, a "lower layer" refers to a layer formed in a process before the layer being compared, and an "upper layer" refers to a layer formed in a process after the layer being compared. Hereinafter, for convenience of explanation, components the same as those described in a specific embodiment are denoted by the same reference numerals, and descriptions thereof will be omitted.

First Embodiment

FIG. 1 is a plan view illustrating an example of a configuration of a display device 1 according to a first embodiment. In FIG. 1, of the display device 1, a flat surface of a part of a display region in which an image is displayed is illustrated. The display region of the display device 1 is a region in which a plurality of pixels each including light-emitting elements 5R, 5G, and 5B, which are a plurality of subpixels, are arranged. Note that although not illustrated, the display device 1 includes a frame region (not illustrated) surrounding the display region in addition to the display region. The frame region is a region in which circuit components such as various drivers are provided and an image is not displayed.

For example, the display device 1 is, what is called, a mirror display that functions as a display in which an image is displayed and also functions as a mirror. For example, the display device 1 includes a first reflective layer 20 provided in the display region in which an image is displayed. The surface of the first reflective layer 20 is a mirror surface and reflects external light Y that is light around the display device 1. This causes the display device 1 to function as a mirror. Note that the mirror surface is a surface having high flatness, high reflectance, and small surface roughness.

The light-emitting element 5G, the light-emitting element 5R, and the light-emitting element 5B provided in the display region of the display device 1 respectively emit first color light of a first color, second color light of a second color, and third color light of a third color, the first color light, the second color light, and the third color light being visible light and of mutually different colors.

The light-emitting element 5G emits the first color light, and includes a first reflective layer 20 and a first opening 20aG that is an opening formed in the first reflective layer 20. The light-emitting element 5G emits, for example, green light XG as the first color light. In the light-emitting element 5G, a region around the first opening 20aG is covered with the first reflective layer 20. As a result, the green light XG emitted by the light-emitting element 5G is emitted to the outside of the first reflective layer 20 from the first opening 20aG adjacent to the first reflective layer 20.

The light-emitting element 5R emits the second color light, and includes the first reflective layer 20 and a first opening 20aR that is an opening formed in the first reflective layer 20. The light-emitting element 5R emits, for example, red light XR as the second color light. In the light-emitting element 5R, a region around the first opening 20aR is covered with the first reflective layer 20. As a result, the red light XR emitted by the light-emitting element 5R is emitted to the outside of the first reflective layer 20 from the first opening 20aR adjacent to the first reflective layer 20.

The light-emitting element 5B emits the third color light, and includes the first reflective layer 20 and a first opening 20aB that is an opening formed in the first reflective layer 20. The light-emitting element 5B emits, for example, blue light XB as the third color light. In the light-emitting element 5B, a region around the first opening 20aB is covered with the first reflective layer 20. As a result, the blue light XB emitted by the light-emitting element 5B is emitted to the outside of the first reflective layer 20 from the first opening 20aB adjacent to the first reflective layer 20.

As described above, the display region of the display device 1 functions as a display when the plurality of first openings 20aB, 20aG, and 20aR are arranged, and also functions as a mirror when the surface of the first reflective layer 20 is a mirror surface. That is, the surface of the first reflective layer 20 is a mirror surface and is also a display surface of an image. A region in which the surface of the first reflective layer 20 is mirror-finished (that is, a region that functions as a mirror) may coincide with the display region, may be a partial region of the display region, or may be a region larger than the display region that includes the display region.

In the present embodiment, the first reflective layer 20 is not divided into a plurality of portions but is formed being continuous over the plurality of light-emitting elements 5B, 5G, and 5R. However, the first reflective layer 20 is not limited thereto, and may be formed being a set of a plurality of divided regions for one or a plurality of light-emitting elements.

Note that in the following description, in a case where the light-emitting elements 5B, 5G, and 5R are not distinguished from each other, they will be described as a light-emitting element 5, in a case where the first openings 20aB, 20aG, and 20aR are not distinguished from each other, they will be described as a first opening 20a, and in a case where the blue light XB, the green light XG, and the red light XR are not distinguished from each other, they will be described as light X.

Figure 2:
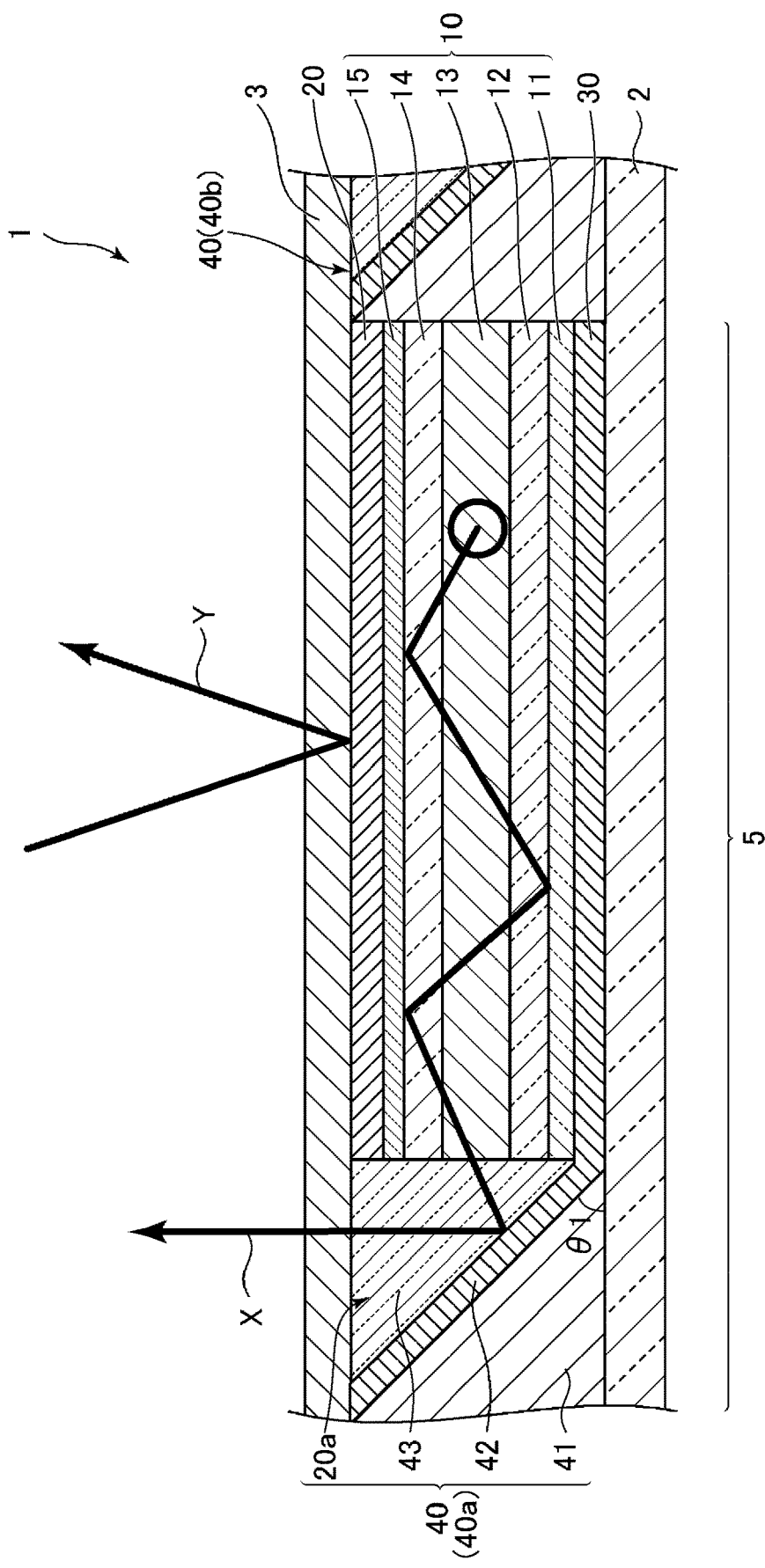
FIG. 2 is a cross-sectional view illustrating an example of a configuration of a light-emitting element of the display device according to the first embodiment.

FIG. 2 is a cross-sectional view illustrating an example of a configuration of the light-emitting element 5 of the display device 1 according to the first embodiment. As illustrated in FIG. 2, the display device 1 includes a substrate 2, a light-emitting element 5 provided in an upper layer of the substrate 2, and a transparent substrate 3 provided in an upper layer of the light-emitting element 5. The light-emitting element 5 includes a light-emitting portion 10, a first reflective layer 20 provided in an upper layer of the light-emitting portion 10, a third reflective layer 30 provided in a lower layer of the light-emitting portion 10, and a light-exiting portion 40 adjacent to the light-emitting portion 10.

The light-emitting portion 10 includes, for example, a light guide layer (first light guide layer) 11, a first electrode 12, a light-emitting layer (first light-emitting layer) 13, a second electrode 14, and a light guide layer (first light guide layer) 15 which are provided in this order from the substrate 2 side to the first reflective layer 20 side. The light-exiting portion 40 includes, for example, a first opening 20a that is an opening of the first reflective layer 20, an insulating layer 41, a second reflective layer 42, and a transmissive portion 43.

The substrate 2 is an active matrix substrate in which a thin film transistor (TFT) is formed for each subpixel. The substrate 2 includes, for example, an insulating substrate, a barrier layer formed in an upper layer of the insulating substrate, a TFT layer formed in an upper layer of the barrier layer, and the like. The insulating substrate only needs to have insulating properties, may be formed of an inorganic material such as glass or quartz, or may be formed of a resin material such as polyethylene terephthalate or a polyimide resin.

The barrier layer is a layer that inhibits foreign matters such as water and oxygen from entering the TFT layer, and can be formed of a silicon oxide film, a silicon nitride film, a silicon oxynitride film, or a layered film of these, by a chemical vapor deposition (CVD) method, for example.

The TFT layer includes a semiconductor film, an inorganic insulating film (gate insulating film) in an upper layer overlying the semiconductor film, a gate electrode and a gate wiring line in an upper layer overlying the inorganic insulating film, an inorganic insulating film in an upper layer overlying the gate electrode and the gate wiring line, a capacitance electrode in an upper layer overlying the inorganic insulating film, an inorganic insulating film in an upper layer overlying the capacitance electrode, a source wiring line in an upper layer overlying the inorganic insulating film, and a flattening film (interlayer insulating film) in an upper layer overlying the source wiring line.

The semiconductor film is constituted of, for example, a low-temperature polysilicon (LTPS) or an oxide semiconductor (for example, an In—Ga—Zn—O-based semiconductor), and a thin film transistor (TFT) is configured to include the semiconductor film and the gate electrode. The thin film transistor may have a top gate structure or may have a bottom gate structure.

The gate electrode, the gate wiring line, the capacitance electrode, and the source wiring line are each composed of a single layer film or a layered film of a metal including at least one of aluminum, tungsten, molybdenum, tantalum, chromium, titanium, and copper, for example.

The inorganic insulating film can be formed of, for example, a silicon oxide (SiOx) film or a silicon nitride (SiNx) film, or a layered film of these, formed by CVD. The flattening film may be formed of coatable organic materials such as polyimide and acrylic, for example.

The transparent substrate 3 is provided on the first reflective layer 20 and the light-exiting portion 40. The transparent substrate 3, as a protection layer, prevents oxygen and moisture from entering the light-emitting portion 10 from the outside of the display device 1. The transparent substrate 3 can be formed of a transparent insulating material. The transparent substrate 3 is provided common to all subpixels. Note that the transparent substrate 3 needs to be provided only as necessary.

The light-emitting portion 10 is provided between the first reflective layer 20 provided in an upper layer of the light-emitting portion 10 and the third reflective layer 30 provided in a lower layer of the light-emitting portion 10. The light-emitting portion 10 emits light X, and the emitted light X is reflected by the first reflective layer 20 provided in the upper layer and the third reflective layer 30 provided in the lower layer to be guided to the adjacent light-exiting portion 40.

Note that the light X emitted from the light-emitting portion 10 is caused to exit to the outside via the light-exiting portion 40 adjacent to the light-emitting portion 10, and thus the light-emitting portion 10 in the light-emitting element 5 can also be expressed as a portion that does not play a role of causing the emitted light X to exit to the outside of the display device 1.

The first reflective layer 20 and the third reflective layer 30 are provided facing each other with the light-emitting portion 10 interposed therebetween, and reflect the light X emitted from the light-emitting portion 10. The first reflective layer 20 is provided on the light-emitting portion 10, for example. The first reflective layer 20 overlaps with the light-emitting portion 10, reflects the external light Y on its front surface, and reflects the light X emitted from the light-emitting portion 10 on its back surface. The third reflective layer 30 is provided on the substrate 2 and below the light-emitting portion 10, and is provided for each light-emitting element 5 (for each subpixel), for example. The third reflective layer 30 reflects the light X emitted from the light-emitting portion 10 on its front surface, and has a back surface in contact with the front surface of the substrate 2.

The first reflective layer 20 and the third reflective layer 30 are formed of a material having a high reflectance, for example, a metal material such as silver or aluminum. As described above, in particular, the surface of the first reflective layer 20 is mirror-finished and functions as a mirror. Note that the third reflective layer 30 may be continuously formed over the plurality of light-emitting elements 5 (plurality of subpixels).

The first electrode 12 and the second electrode 14 are provided facing each other with the light-emitting layer 13 interposed therebetween, and may be transparent electrodes that use a transparent electrode material, reflective electrodes that use a reflective electrode material, or electrodes including a reflective layer. Examples of the transparent electrode material include indium tin oxide (ITO), tin oxide ($SnO_2$), indium zinc oxide (IZO), and gallium-added zinc oxide (GZO). Examples of the reflective electrode material include a black electrode material such as tantalum (Ta) or carbon (C), Al, Ag, Au, Al—Li alloy, Al-neodymium (Nd) alloy, and Al-silicon (Si) alloy.

At least one of the first electrode 12 and the second electrode 14 is preferably a transparent electrode because the extraction efficiency of light is increased. In the present embodiment, for example, both the first electrode 12 and the second electrode 14 are transparent electrodes.

The first electrode 12 is, for example, a pixel electrode formed into an island shape for each light-emitting element 5 (each subpixel), and is connected to the thin film transistor formed in the TFT layer in the substrate 2 via a contact hole provided in a lower layer (the light guide layer 11 and the third reflective layer 30) underlying the first electrode 12.

The second electrode 14 is an electrode paired with the first electrode 12 to cause the light-emitting layer 13 to emit light. The second electrode 14 is, for example, a common electrode. The second electrode 14 may be formed into an island shape for each light-emitting element 5 (each subpixel), or may be continuously formed over the plurality of light-emitting elements 5 (plurality of subpixels).

One of the first electrode 12 and the second electrode 14 functions as an anode electrode, and the other functions as a cathode electrode. The first electrode 12 may be the cathode electrode, and the second electrode 14 may be the anode electrode. Conversely, the first electrode 12 may be the anode electrode, and the second electrode 14 may be the cathode electrode. In a case in which the anode electrode and cathode electrode are reversed, the layering order or carrier mobility (carrier transport properties, that is, hole transport properties and electron transport properties) of each function layer described below are reversed accordingly.

The light-emitting layer 13 is provided between the first electrode 12 and the second electrode 14. The light-emitting layer 13 is a layer that emits the light X on the basis of the holes (positive holes) injected from the anode electrode side and the electrons injected from the cathode electrode side. The light-emitting layer 13 may have a single layer configuration or a multilayer configuration including a plurality of layers.

For example, the light-emitting element 5 including the light-emitting layer 13 may be an organic light emitting diode (OLED), a light-emitting diode using a quantum dot (QLED), or a micro LED.

In a case in which the light-emitting element 5 is an OLED, positive holes and electrons recombine inside the light-emitting layer 13 in response to a drive current between the anode electrode and the cathode electrode, and light is emitted in the process in which the excitons generated in this manner transition to a ground state. In a case in which the light-emitting element 5 is a QLED, positive holes and electrons recombine inside the light-emitting layer 13 in response to a drive current between the anode electrode and the cathode electrode, and light (fluorescence) is emitted in the process in which the excitons generated in this manner transition from a conduction band level to a valence band level of the quantum dot.

Various known types of light-emitting material may be employed as the material of the light-emitting layer 13 (namely, a light-emitting substance), and the material is not limited to a specific material. A light-emitting material having a high light-emitting efficiency is preferably employed therefor, such as a low molecular weight fluorescent colorant or a metal complex.

Examples of the light-emitting material include anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, and derivatives thereof; a tris(8-quinolinolato)aluminum complex; a bis(benzoquinolinolato) beryllium complex; a tri(dibenzoylmethyl)phenanthroline europium complex; ditoluylvinylbiphenyl; and nanocrystals containing phosphors such as InP and CdSe.

The light guide layer 11 is provided in a lower layer underlying the light-emitting layer 13 and is provided, for example, between the third reflective layer 30 and the first electrode 12. The light guide layer 15 is provided in an upper layer overlying the light-emitting layer 13, and is provided, for example, between the first reflective layer 20 and the second electrode 14. The light guide layer 11 and the light guide layer 15 are layers that guide the light X emitted from the light-emitting layer 13 to the light-exiting portion 40, and are each formed of a transparent material such as a transparent resin material. Alternatively, the light guide layer 11 or the light guide layer 15 may be a gas. The light guide layer 11 and the light guide layer 15 may each have a single layer configuration or a multilayer configuration formed by layering a plurality of layers. Note that at least one of the light guide layer 11 and the light guide layer 15 may be omitted.

The light guide layer 11 may be provided between the light-emitting layer 13 and the first electrode 12. However, in a case in which the light guide layer 11 is provided between the light-emitting layer 13 and the first electrode 12, the light guide layer 11 needs to have conductivity and thus contains a conductive material. Alternatively, the light guide layer 15 may be provided between the light-emitting layer 13 and the second electrode 14. However, in a case in which the light guide layer 15 is provided between the light-emitting layer 13 and the second electrode 14, the light guide layer 15 needs to have conductivity and thus contains a conductive material.

A refractive index of the light guide layer 11 is preferably adjusted in accordance with a refractive index of the light-emitting layer 13 and a refractive index of the first electrode 12 so that the light X emitted from the light-emitting layer 13 can be efficiently guided to the light-exiting portion 40. A refractive index of the light guide layer 15 is preferably adjusted in accordance with the refractive index of the light-emitting layer 13 and a refractive index of the second electrode 14 so that the light X emitted from the light-emitting layer 13 can be efficiently guided to the light-exiting portion 40. FIG. 2 illustrates, as an example, a state in which the light X emitted from the light-emitting layer 13 is totally reflected at an interface between the second electrode 14 and the light guide layer 15 and is totally reflected at an interface between the first electrode 12 and the light guide layer 11. The refractive index of each of the light guide layer 11 and the light guide layer 15 will be described in detail below.

In addition. the light-emitting portion 10 may include further function layers between the first electrode 12 and the light-emitting layer 13 and between the light-emitting layer 13 and the second electrode 14, as necessary. Examples of the function layer include layers such as a hole injection layer, a hole transport layer, an electron transport layer, and an electron injection layer.

The hole injection layer is a layer including a material with hole injecting properties and having the function to increase the efficiency of hole injection from the anode electrode to the light-emitting layer 13. The hole transport layer is a layer including a material with hole transport properties and having the function to increase the efficiency of hole transport to the light-emitting layer 13. The electron injection layer is a layer including a material with electron injecting properties and having the function to increase the efficiency of electron injection from the cathode electrode to the light-emitting layer 13. The electron transport layer is a layer including a material with electron transport properties and having the function to increase the efficiency of electron transport to the light-emitting layer 13.

The hole injection layer and the hole transport layer may be formed as mutually independent layers, or may be integrated together as a hole injection-cum-transport layer. Similarly, the electron injection layer and the electron transport layer may be formed as mutually independent layers, or may be integrated together as an electron injection-cum-transport layer. Only one of the hole injection layer and the hole transport layer may be provided. Similarly, only one of the electron injection layer and the electron transport layer may be provided.

Further, other than the function layer stated above, a carrier block layer, an intermediate layer, or the like may be provided. Note that the material of these function layers and the like is also not limited, and known materials may be employed as each such layers. Further, these function layers and the like are not essential layers, and layer thicknesses thereof are not limited to specific values. Thus, the description thereof is omitted in the present embodiment.

The insulating layer 41 is provided on the substrate 2 so that its side surface has a forward tapered shape (a shape in which its width increases from the top surface to the substrate 2 side). The insulating layer 41 is formed of an insulating material such as a resin.

The second reflective layer 42 reflects the light X emitted from the light-emitting layer 13 toward the first opening 20a to emit the light X to the outside of the light-emitting element 5 through the first opening 20a. The second reflective layer 42 is provided on the insulating layer 41. The second reflective layer 42 is provided inclined relative to the substrate 2 so as to go away from the light-emitting portion 10 from an end portion on a side close to the substrate 2 to an end portion on a side far from the substrate 2.

An angle at which the second reflective layer 42 is inclined relative to the substrate 2 is defined as an angle θ1. The angle θ1 may be any angle, but is preferably about 45 degrees or less. Furthermore, the angle θ1 is more preferably from 30 degrees to about 45 degrees. This makes it possible to efficiently reflect the light X emitted from the light-emitting layer 13 toward the first opening 20a and emit the light X to the outside. On the other hand, when the angle θ1 is set to greater than 45°, for example, it is possible to reduce the area of the first opening 20a, and thus suppress external light reflection due to the first opening 20a.

The surface of the second reflective layer 42 may be a flat surface, a curved surface, or a combination of a curved surface and a plurality of flat surfaces.

The transmissive portion 43 transmits the light X reflected by the second reflective layer 42 and emits the light X from the surface. The transmissive portion 43 is provided on the second reflective layer 42. The transmissive portion 43 can be formed of, for example, a transparent resin material.

Hereinafter, the light-exiting portion 40 included in the light-emitting element 5 of interest may be referred to as a light-exiting portion 40a, and the light-exiting portion 40 included in the light-emitting element 5 adjacent to the light-emitting element 5 of interest may be referred to as a light-exiting portion 40b. In the present embodiment, the light-emitting portion 10 included in the light-emitting element 5 of interest is provided between the light-exiting portion 40a and the light-exiting portion 40b.

Figure 3:
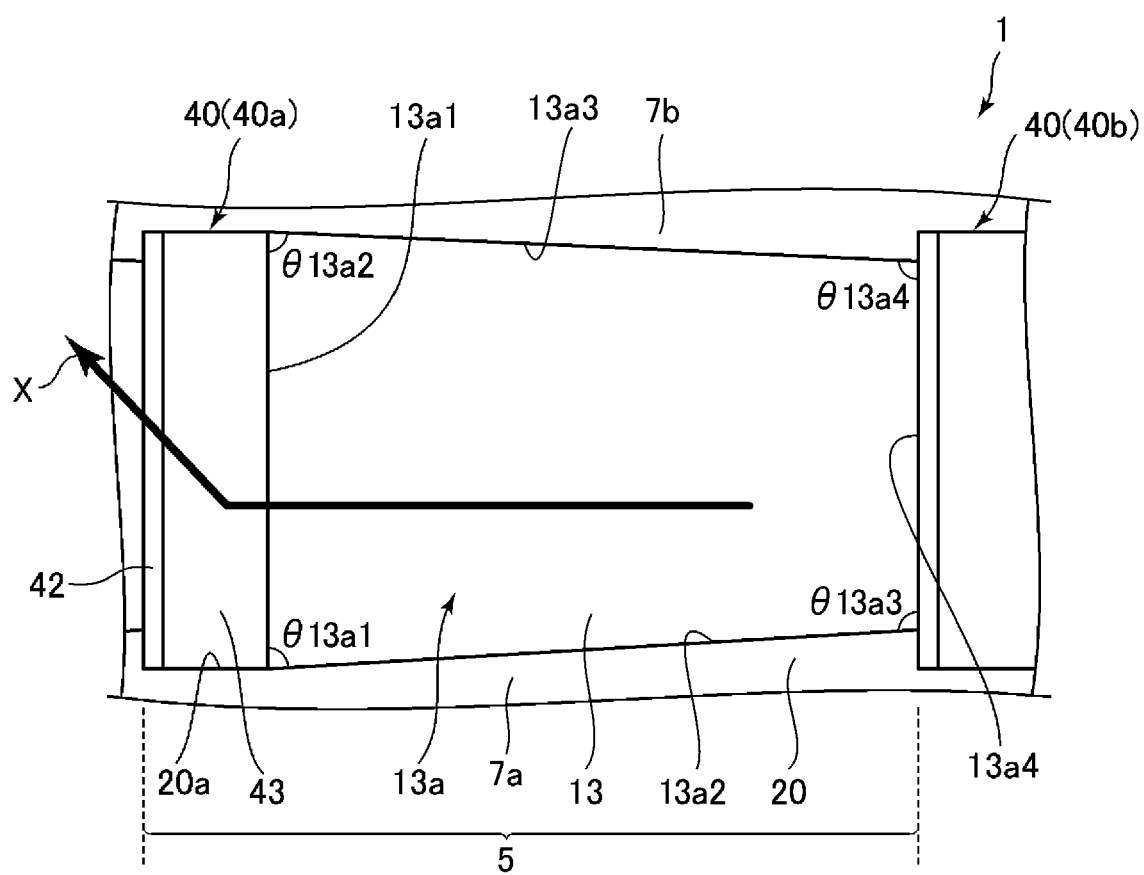
FIG. 3 is a plan view illustrating an example of the configuration of the light-emitting element of the display device according to the first embodiment.

FIG. 3 is a plan view illustrating an example of the configuration of the light-emitting element 5 of the display device 1 according to the first embodiment. Note that in FIG. 3, the transparent substrate 3 and each layer provided on the light-emitting element 5 are not illustrated.

As illustrated in FIG. 3, a bank 7a and a bank 7b are provided with the light-emitting element 5 interposed therebetween. For example, each of the bank 7a and the bank 7b extends in one direction. The bank 7a and the bank 7b are formed of, for example, a resin material or the like.

The light-emitting layer 13 has a light-emitting region 13a that is a region emitting the light X. The light-emitting region 13a overlaps with both the first electrode 12 and the second electrode 14 to emit the light X. In other words, the light-emitting region 13a is a region formed for each light-emitting element 5 (for each subpixel) to correspond to island-shaped electrodes (for example, pixel electrodes) formed for each light-emitting element 5 (for each subpixel) among the first electrode 12 and the second electrode 14.

That is, the light-emitting region 13a is a region surrounded by a first side 13a1 in contact with the light-exiting portion 40a, a second side 13a2 in contact with the bank 7a, a third side 13a3 in contact with the bank 7b, and a fourth side 13a4 in contact with the light-exiting portion 40b, in a plan view. The second side 13a2 and the third side 13b3 are sides adjacent to the first side 13a1. The fourth side 13a4 is a side adjacent to the second side 13a2 and the third side 13a3 and facing the first side 13a1.

Further, in other words, the light-exiting portion 40a, the bank 7a, the bank 7b, and the light-exiting portion 40b are a partition wall portion surrounding the light-emitting region 13a, and the light-emitting region 13a is an inner region surrounded by the partition wall portion in the light-emitting layer 13, in a plan view. The partition wall portion is formed into a frame shape so as to overlap with an edge of an electrode (for example, a pixel electrode) formed into an island shape for each light-emitting element 5 (for each subpixel) among the first electrode 12 and the second electrode 14.

In the present embodiment, the light-exiting portion 40a is provided along the first side 13a1 of the light-emitting region 13a. This makes it possible to emit the light X emitted from the light-emitting region 13a to the outside from the light-exiting portion 40a adjacent to the light-emitting region 13a.

In addition, in the present embodiment, for example, in the light-emitting region 13a, the width between the second side 13a2 and the third side 13a3 gradually increases from an end portion on the side close to the fourth side 13a4 to an end portion on the side close to the first side 13a1, in a plan view.

In other words, an angle formed by the first side 13a1 and the second side 13a2 is defined as an angle θ13a1, an angle formed by the first side 13a1 and the third side 13a3 is defined as an angle θ13a2, an angle formed by the second side 13a2 and the fourth side 13a4 is defined as an angle θ13a3, and an angle formed by the third side 13a3 and the fourth side 13a4 is defined as an angle θ13a4. In the present embodiment, the angle θ13a1 and the angle θ13a2 are each smaller than 90 degrees, and the angle θ13a3 and the angle θ13a4 are each larger than 90 degrees.

In other words, sides facing each other such as the second side 13a2 and the third side 13a3 illustrated in FIG. 3 are formed not being parallel to each other.

This can prevent light generated in the light-emitting layer 13 from repeatedly reflecting between the sides (the second side 13a2 and the third side 13a3) facing each other. As a result, it is possible to efficiently guide the light X toward the light-exiting portion 40a. This makes it possible to efficiently emit the light X from the first opening 20a of the light-exiting portion 40a to the outside.

Note that although description is given in the present embodiment assuming that the planar shape of the light-emitting layer 13 and the planar shape of the light-emitting region 13a are the same, the light-emitting region 13a may be a partial region of the light-emitting layer 13, and a region outside the light-emitting region 13a may be, for example, on the bank 7a or 7b. As described above, the planar shape of the light-emitting layer 13 and the planar shape of the light-emitting region 13a may be different from each other. This makes it possible to form the light-emitting layer 13 (in other words, the light-emitting region 13a) with high accuracy, even in a case in which the light-emitting layer 13 is pattern-formed by vapor deposition using a mask, for example.

Figure 4:
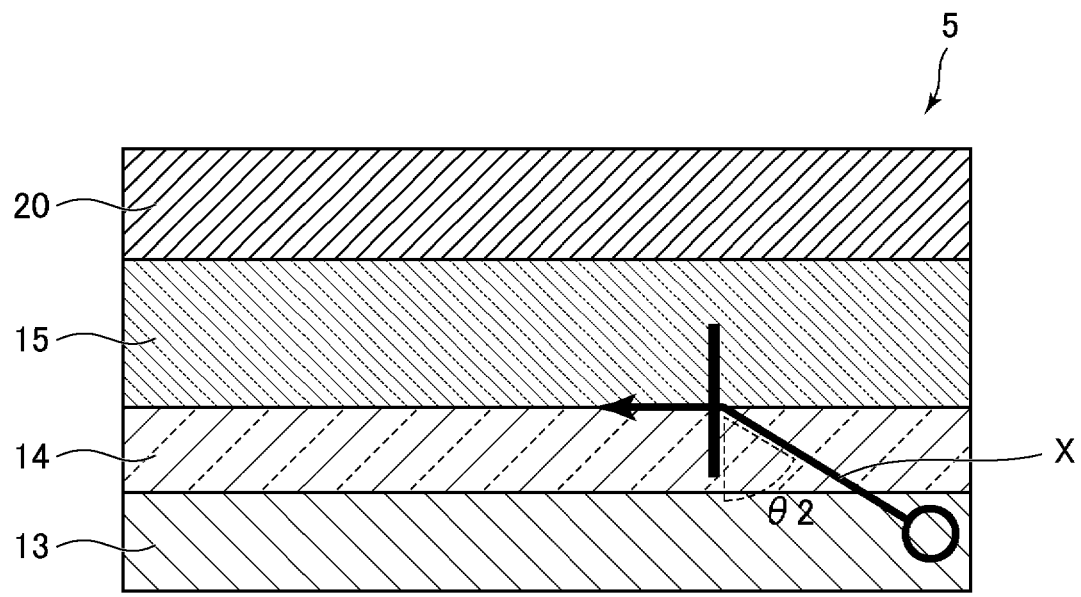
FIG. 4 is a diagram illustrating a state of light refracting between layers of a light-emitting layer, a second electrode, and a light guide layer in the light-emitting element according to the first embodiment.

FIG. 4 is a diagram illustrating a state of the light X refracting between layers of the light-emitting layer 13, the second electrode 14, and the light guide layer 15 in the light-emitting element 5 according to the first embodiment.

Figure 5:
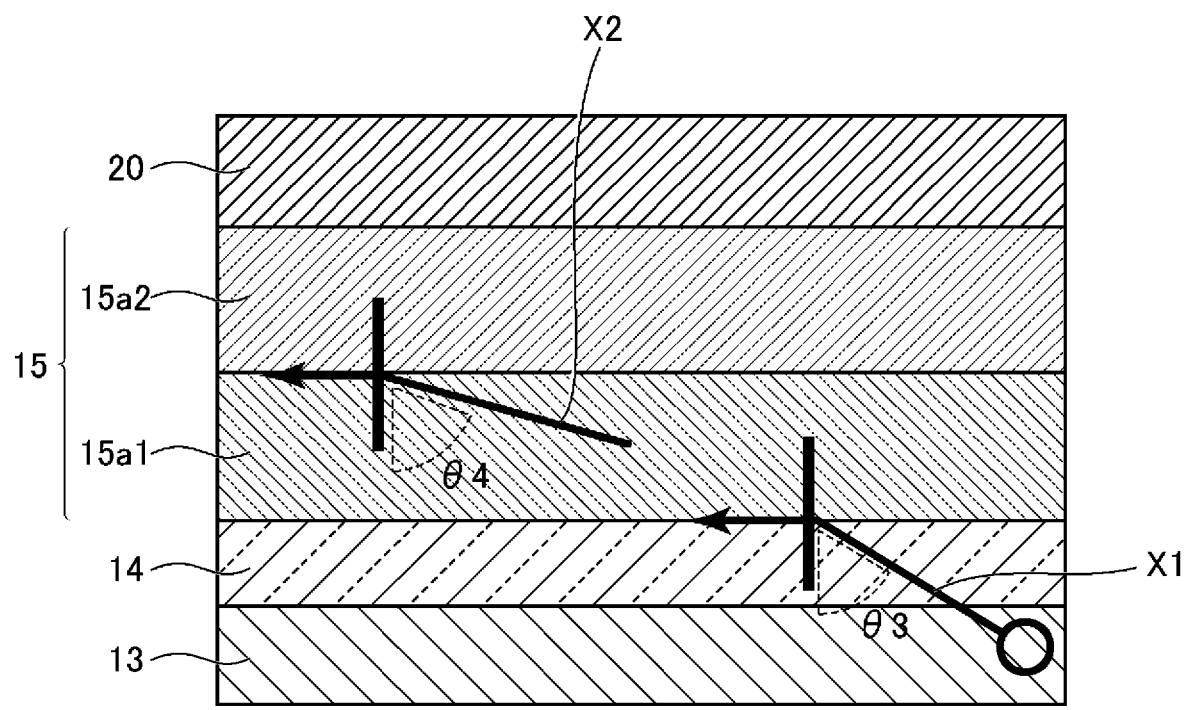
FIG. 5 is a diagram illustrating a state of light refracting between layers of the light-emitting layer, the second electrode, and a plurality of light guide layers in the light-emitting element according to the first embodiment.

Light (indicated by a circle in FIG. 4) generated in the light-emitting layer 13 travels toward the second electrode 14 as indicated by the light X in FIG. 4, for example. Thereafter, a part of the light that is not totally reflected between the light-emitting layer 13 and the second electrode 14 travels into the second electrode 14 as illustrated in FIG. 4. In FIG. 4 and FIG. 5 to be described below, for convenience, the light X is illustrated to travel linearly between the light-emitting layer 13 and the second electrode 14, but the light X is refracted in accordance with the refractive index of the light-emitting layer 13 and the second electrode 14. The light X that has traveled into the second electrode 14 is totally reflected at the interface between the second electrode 14 and the light guide layer 15 in accordance with the refractive index of the second electrode 14 and the light guide layer 15, propagates in the lateral direction, and reaches the light-exiting portion 40.

Here, to achieve total reflection, the light guide layer 11, the first electrode 12, the second electrode 14, and the light guide layer 15 are preferably layered so that the refractive index decreases from the layer closest to the light-emitting layer 13 toward the layer farthest from the light-emitting layer 13.

For example, the refractive index of the light guide layer 11 positioned between the first electrode 12 and the substrate 2 is preferably lower than the refractive index of the first electrode 12. Similarly, the refractive index of the light guide layer 15 positioned between the second electrode 14 and the first reflective layer 20 is preferably lower than the refractive index of the second electrode 14.

With such a configuration, as illustrated in FIG. 4, of the light X emitted from the light-emitting layer 13, light incident on the interface between the second electrode 14 and the light guide layer 15 at an angle equal to or greater than a critical angle $\theta 2$ is totally reflected at this interface and propagates in the lateral direction.

As an example, the refractive index of the light-emitting layer 13 is 2, the second electrode 14 is composed of indium tin oxide having a refractive index of 2, and the light guide layer 15 is composed of polymethyl methacrylate having a refractive index of 1.5. At this time, the critical angle $\theta 2$ is 49°.

Accordingly, of the light X emitted from the light-emitting layer 13, light incident on the interface between the second electrode 14 and the light guide layer 15 at an angle equal to or greater than 49° (approximately 46%) is totally reflected at the interface between the layers and propagates in the lateral direction. On the other hand, light incident at an angle of less than 49° is transmitted through the light guide layer 15, reaches the first reflective layer 20, and is reflected by the first reflective layer 20. However, the light path becomes longer by the amount of reciprocation in the light guide layer 15, and light intensity is lost. In this aspect, at least approximately 46% of the light X emitted by the light-emitting layer 13 can be guided to the transmissive portion 43 by total reflection.

Next, on the basis of FIG. 5, the movement of light generated in the light-emitting layer 13 in a case in which the light guide layer 15 includes a plurality of light guide layers formed of a transparent resin will be described below. FIG. 5 is a diagram illustrating a state of light refracting between layers of the light-emitting layer, the second electrode, and a plurality of light guide layers in the light-emitting element according to the first embodiment.

In a case in which the light guide layer 15 has a plurality of light guide layers that are sequentially layered, the plurality of light guide layers are sequentially layered in such a manner that the refractive index decreases from the light guide layer closest to the light-emitting layer 13 toward the light guide layer farthest from the light-emitting layer 13, and the refractive index of the light guide layer closest to the light-emitting layer 13 is preferably lower than or equal to the refractive index of the light-emitting layer 13.

For example, it is assumed that the light guide layer 15 includes a plurality of light guide layers 15a1 and 15a2 layered in order, the light guide layer 15a1 is provided on the second electrode 14, the light guide layer 15a2 is provided on the light guide layer 15a1, and the first reflective layer 20 is provided on the light guide layer 15a2.

The refractive index of the light guide layer 15a2 is smaller than the refractive index of the light guide layer 15a1, and the refractive index of the light guide layer 15a2 is smaller than the refractive index of the light-emitting layer 13 and smaller than the refractive index of the second electrode 14.

With such a configuration, of light X1 generated in the light-emitting layer 13, light incident on an interface between the second electrode 14 and the light guide layer 15a1 at an angle equal to or greater than a critical angle $\theta 3$ is totally reflected at this interface and propagates in the lateral direction. Further, light incident on an interface between the light guide layer 15a1 and the light guide layer 15a2 at an angle equal to or greater than a critical angle $\theta 4$ is totally reflected at this interface and propagates in the lateral direction.

More specifically, the refractive index of the light-emitting layer 13 is 2, the second electrode 14 is formed of indium tin oxide having a refractive index of 2, the light guide layer 15a1 is formed of polymethyl methacrylate having a refractive index of 1.7, and the light guide layer 15a2 is formed of polymethyl methacrylate having a refractive index of 1.5. At this time, the critical angle $\theta 3$ is 58°, and the critical angle $\theta 4$ is 62°.

Accordingly, of the light X1 emitted by the light-emitting layer 13, light incident on the interface between the second electrode 14 and the light guide layer 15a1 at an angle equal to or greater than 58° (approximately 35%) is totally reflected at the interface between the layers and propagates in the lateral direction. On the other hand, light X2 incident at an angle of less than 58° travels in the light guide layer 15a1 and reaches the interface with the light guide layer 15a2. Here, the light incident on the interface at an angle of 62° or greater (approximately 20%) is totally reflected at the interface between the layers and propagates in the lateral direction. In this aspect, approximately 55% of the light X1 emitted by the light-emitting layer 13 can be guided to the transmissive portion 43 by total reflection.

When the number of layers of the light guide layer 15 is increased, it is possible to further enhance the extraction efficiency of light. In addition, similarly, when the number of layers of the light guide layer 11 is increased, it is possible to further enhance the extraction efficiency of light.

At least one of the first electrode 12 and the second electrode 14 is a transparent electrode having a refractive index lower than that of the light-emitting layer 13, and thus a portion of the light generated by the light-emitting layer 13 is totally reflected at an interface between the light-emitting layer 13 and the transparent electrode, propagates in the lateral direction, reaches the light-exiting portion 40, and exits from the first opening 20a.

Second Embodiment

Figure 6:
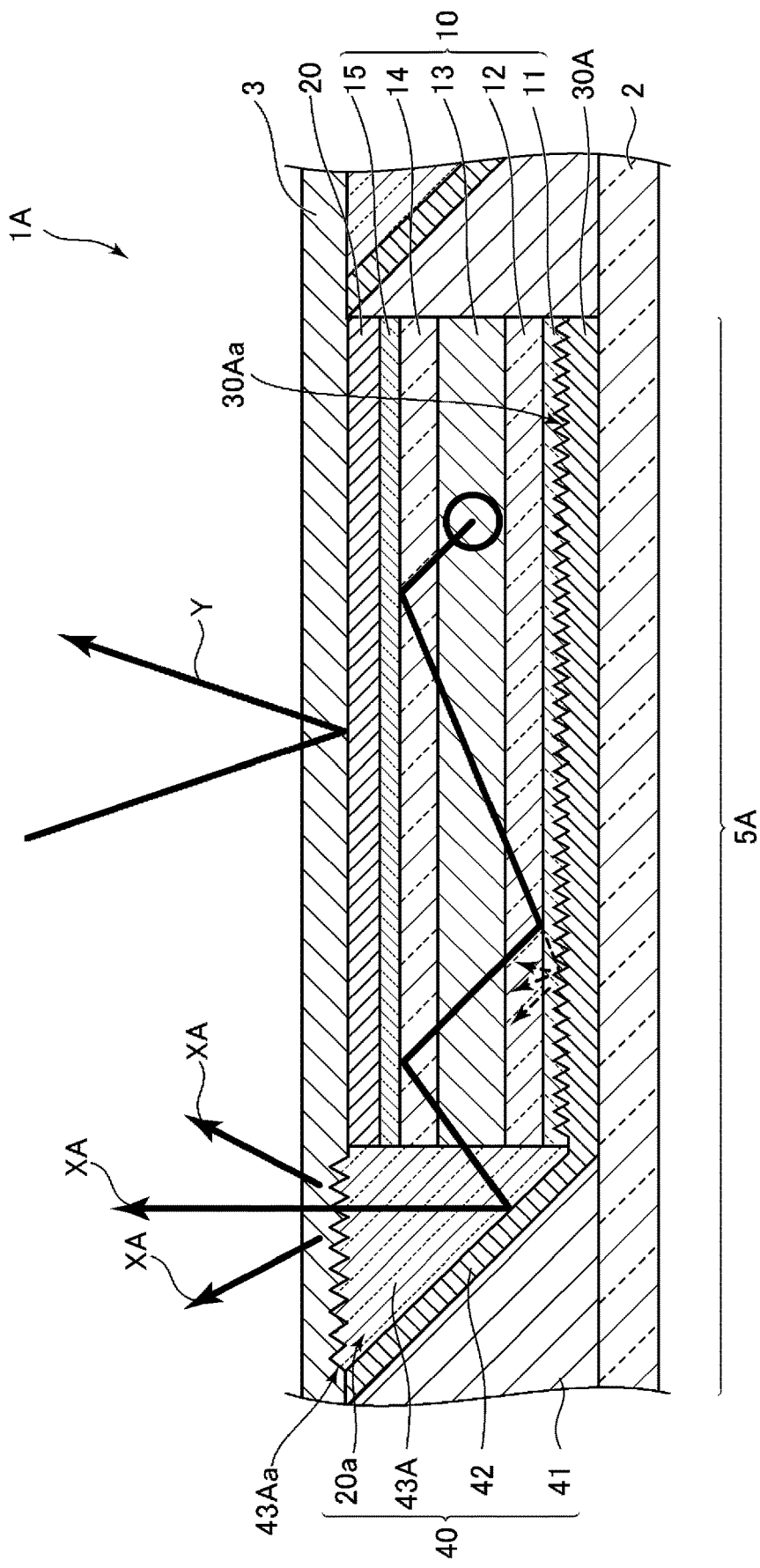
FIG. 6 is a cross-sectional view illustrating an example of a configuration of a light-emitting element of a display device according to a second embodiment.

FIG. 6 is a cross-sectional view illustrating an example of a configuration of a light-emitting element 5A of a display device 1A according to a second embodiment. The display device 1A includes the light-emitting element 5A in place of the light-emitting element 5 included in the display device 1 (FIG. 2). The light-emitting element 5A includes a third reflective layer 30A and a transmissive portion 43A in place of the third reflective layer 30 and the transmissive portion 43 included in the light-emitting element 5 (FIG. 2). The other components of the light-emitting element 5A are the same as those of the light-emitting element 5.

The third reflective layer 30A has a configuration in which a plurality of irregularities (first irregular portions) 30Aa are formed on a front surface of the third reflective layer 30 (FIG. 2). In the example illustrated in FIG. 6, the front surface of the third reflective layer 30A on which the plurality of irregularities 30Aa are formed is a surface on which the light-emitting portion 10 is layered.

The transmissive portion 43A has a configuration in which a plurality of irregularities (second irregular portions) 43Aa are formed on a front surface of the transmissive portion 43 (FIG. 2). In the example illustrated in FIG. 6, the front surface of the transmissive portion 43A on which the plurality of irregularities 43Aa are formed is a surface that overlaps with the first opening 20a in a plan view.

Here, it is assumed that both the back surface of the first reflective layer and the front surface of the third reflective layer, which are each a surface on a side facing the light-emitting layer, are flat surfaces on which irregularities are not formed, that is, the back surface of the first reflective layer and the front surface of the third reflective layer are parallel to each other. In this case, of light emitted from the light-emitting layer, light in a direction perpendicular to the back surface of the first reflective layer and the front surface of the third reflective layer may not be totally reflected and may repeatedly reflect between the first reflective layer and the third reflective layer. Such light may cause a decrease in extraction efficiency of light from the light-emitting element.

On the other hand, in the display device 1A according to the present embodiment, the plurality of irregularities 30Aa are formed on the front surface of the third reflective layer 30A, which is the surface of the third reflective layer 30A on the side facing the light-emitting layer 13. In other words, the back surface of the first reflective layer 20 and the front surface of the third reflective layer 30A, which face each other with the light-emitting layer 13 interposed therebetween, are non-parallel to each other due to the plurality of irregularities 30Aa.

As a result, of light XA emitted from the light-emitting layer 13, a part of the light XA (for example, light in a direction perpendicular to the back surface of the first reflective layer 20) that has reached into the light guide layer 11 from the first electrode 12 without being totally reflected at the interface between the first electrode 12 and the light guide layer 11 is reflected by the plurality of irregularities 30Aa on the front surface of the third reflective layer 30A and becomes light XA traveling at an angle at which total reflection occurs. This makes it possible to reduce the amount of light that is not totally reflected and repeatedly reflects between the first reflective layer and the third reflective layer. As a result, the light XA emitted by the light-emitting layer 13 can be more efficiently guided to the light-exiting portion 40 as compared to a case in which the plurality of irregularities 30Aa are not provided.

When the plurality of irregularities 43Aa are formed on the front surface of the transmissive portion 43A, the light XA emitted from the light-emitting layer 13 and reflected by the second reflective layer 42 is scattered by the plurality of irregularities 43Aa on the front surface of the transmissive portion 43A. This makes it possible to scatter the light XA reflected by the second reflective layer 42 and emit the light XA to the outside as compared to a case in which the plurality of irregularities 43Aa are not provided. As a result, it is possible to widen a viewing angle as compared to the case in which the plurality of irregularities 43Aa are not provided.

Figure 7:
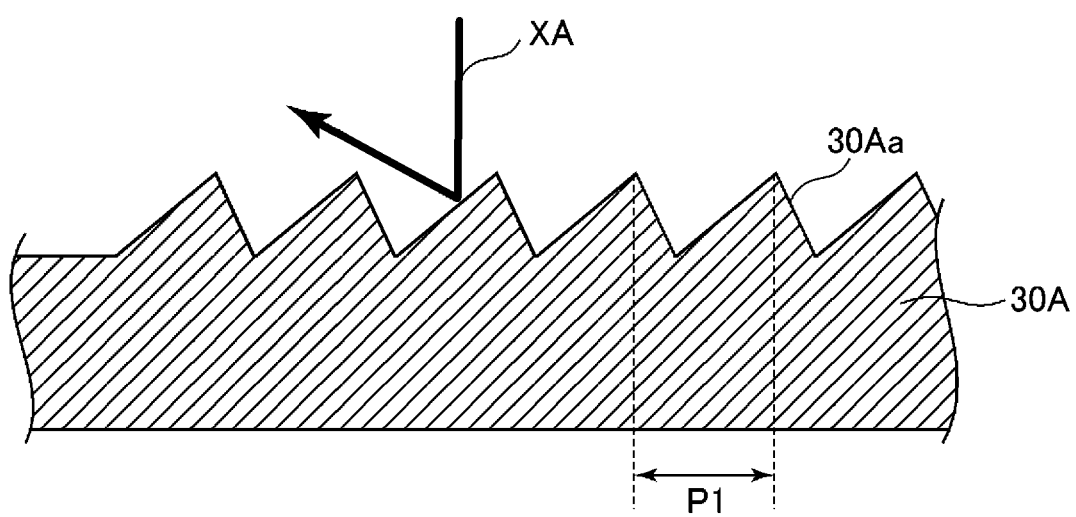
FIG. 7 is an enlarged view of a plurality of irregularities on a surface of a third reflective layer in the light-emitting element according to the second embodiment.
Figure 8:
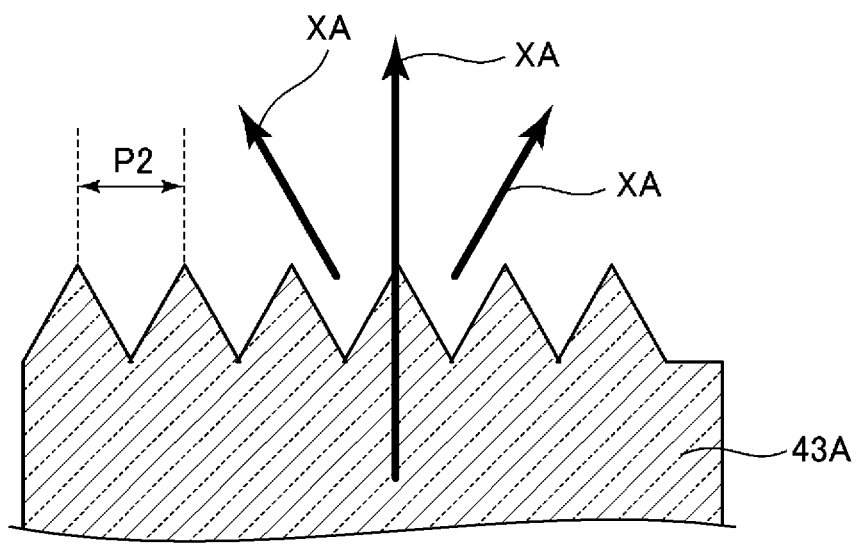
FIG. 8 is an enlarged view of a plurality of irregularities on a surface of a transmissive portion in the light-emitting element according to the second embodiment.

FIG. 7 is an enlarged view of the plurality of irregularities 30Aa on the front surface of the third reflective layer 30A. FIG. 8 is an enlarged view of the plurality of irregularities 43Aa on the front surface of the transmissive portion 43A. For example, the plurality of irregularities 30Aa may be formed in such a manner that a distance P1 between adjacent convex portions is larger than a distance P2 between adjacent convex portions in the plurality of irregularities 43Aa.

In addition, for example, in the plurality of irregularities 43Aa, the distance P2 between adjacent convex portions is preferably equal to or smaller than a wavelength of the light XA from the light-emitting layer 13. This makes it possible to further scatter the light XA emitted from the light-emitting layer 13 and reflected by the second reflective layer 42 by the plurality of irregularities 43Aa and emit the scattered light XA to the outside.

Third Embodiment

Figure 9:
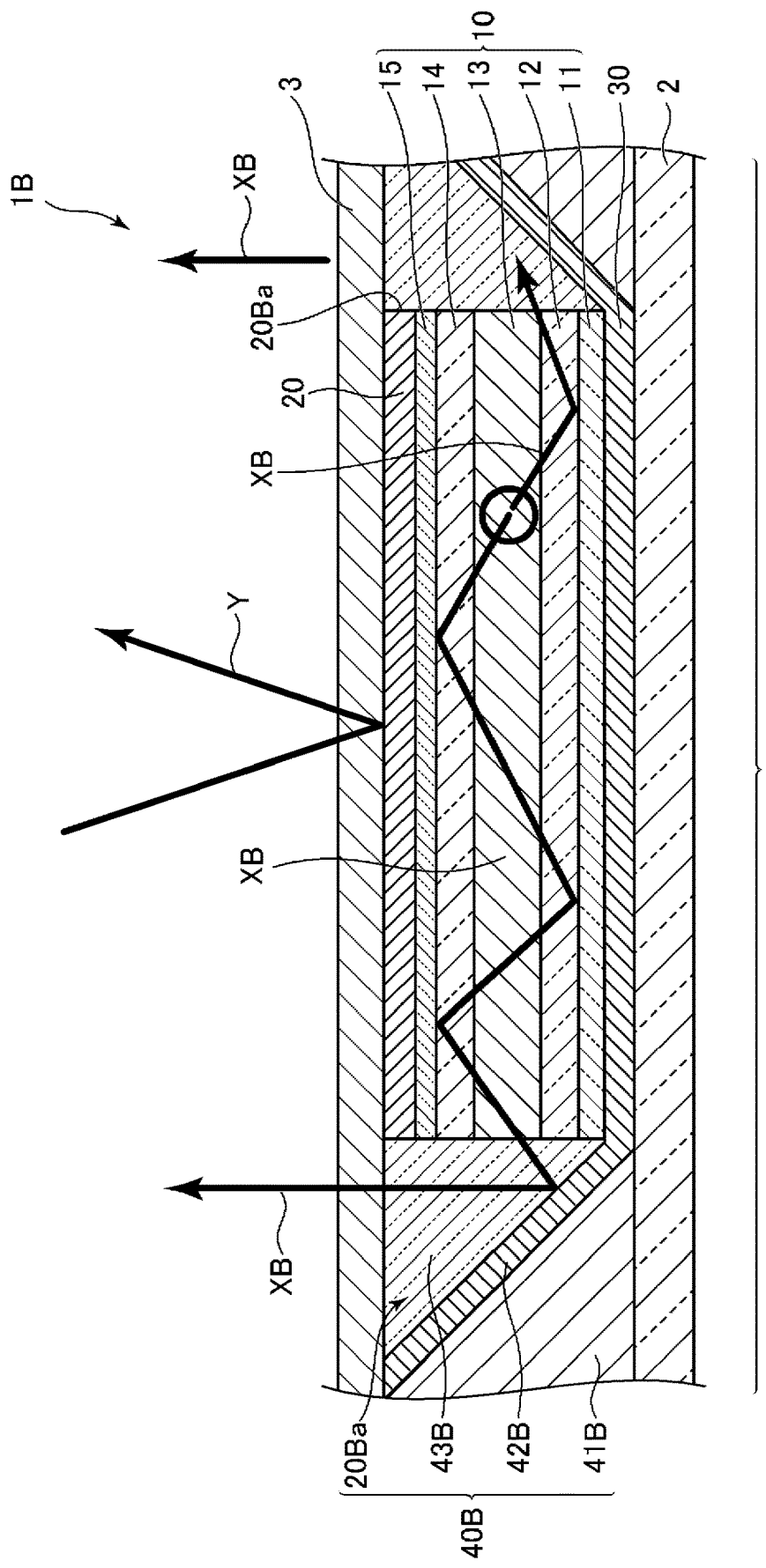
FIG. 9 is a cross-sectional view illustrating an example of a configuration of a light-emitting element of a display device according to a third embodiment.
Figure 10:
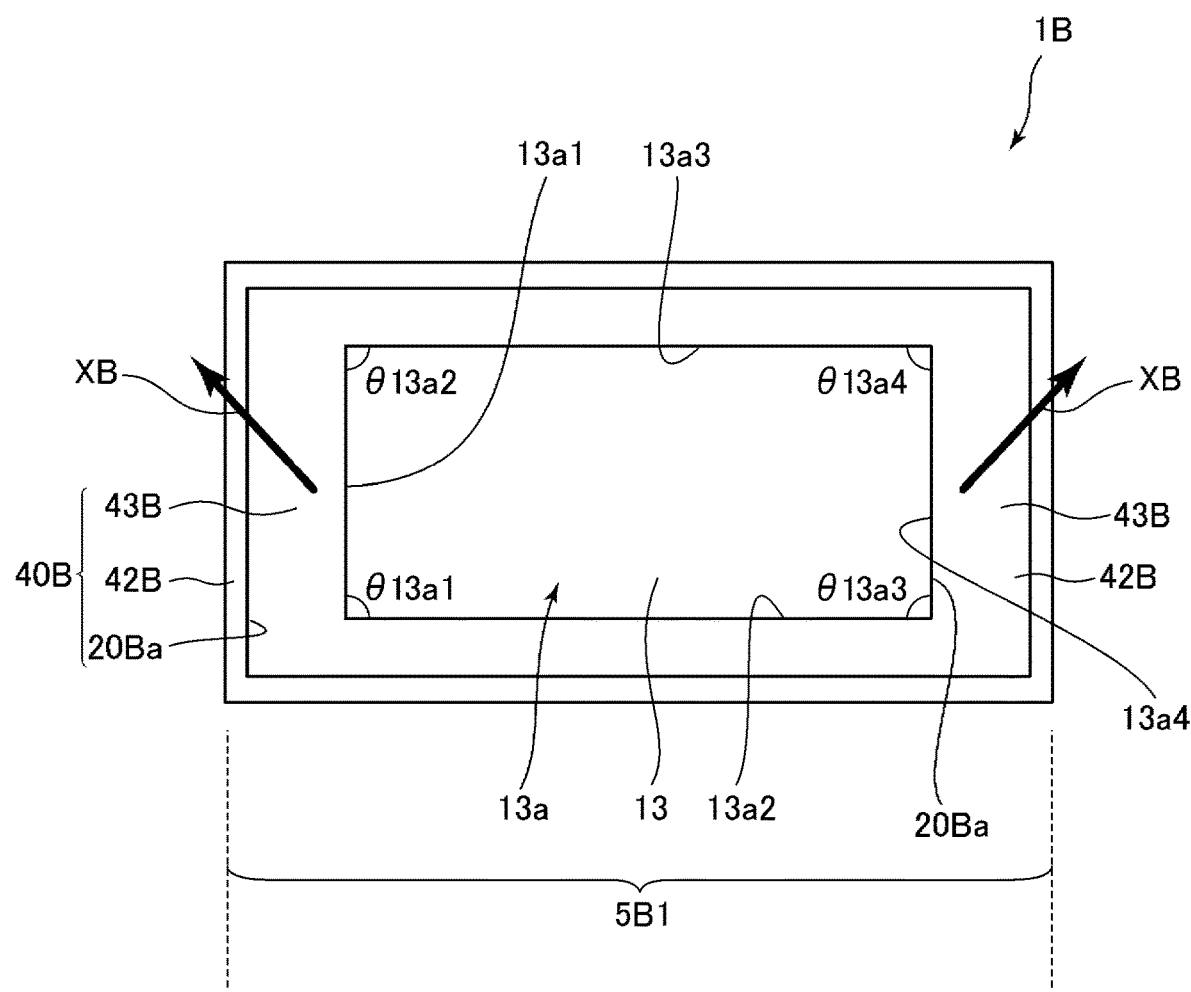
FIG. 10 is a plan view illustrating an example of the configuration of the light-emitting element of the display device according to the third embodiment.

FIG. 9 is a cross-sectional view illustrating an example of a configuration of a light-emitting element 5B1 of a display device 1B according to a third embodiment. FIG. 10 is a plan view illustrating an example of a configuration of the light-emitting element 5B1 of the display device 1B according to the third embodiment.

As illustrated in FIGS. 9 and 10, the display device 1B includes the light-emitting element 5B1 in place of the light-emitting element 5 included in the display device 1 (FIG. 3). The light-emitting element 5B1 includes a light-exiting portion 40B having a frame shape in place of the light-exiting portion 40 included in the light-emitting element 5 (FIG. 3), and the light-emitting region 13a has a different planar shape. The other components of the light-emitting element 5B1 are the same as those of the light-emitting element 5.

The light-exiting portion 40B includes, for example, a first opening 20Ba that is an opening of the first reflective layer 20, an insulating layer 41B, a second reflective layer 42B, and a transmissive portion 43B. The light-exiting portion 40B may be formed into a frame shape so as to surround the light-emitting region 13a. That is, the light-exiting portion 40B is provided along the first side 13a1, the second side 13a2, the third side 13a3, and the fourth side 13a4 in the light-emitting region 13a. This makes it possible to emit light XB emitted from the light-emitting region 13a to the outside in a frame shape from the light-exiting portion 40B adjacent to the light-emitting region 13a. In the present embodiment, the light-exiting portion 40B having a frame shape is the partition wall portion.

In the present embodiment, the light-emitting region 13a has a rectangular shape in a plan view. That is, in the light-emitting region 13a, each of the angle $\theta 13a1$, the angle $\theta 13a2$, the angle $\theta 13a3$, and the angle $\theta 13a4$ is substantially 90 degrees.

Note that although the light-exiting portion 40B is provided adjacently to all sides of the first side 13a1, the second side 13a2, the third side 13a3, and the fourth side 13a4 in the light-emitting region 13a, the light-exiting portion 40B may be provided adjacently to any two sides or any three sides of the four sides.

When the light-exiting portion 40B is provided adjacently to two or more of the four sides of the light-emitting region 13a, it is possible to shorten a waveguide distance of the light XB emitted from the light-emitting layer 13. As a result, it is possible to reduce loss due to attenuation and other factors during propagation.

Figure 11:
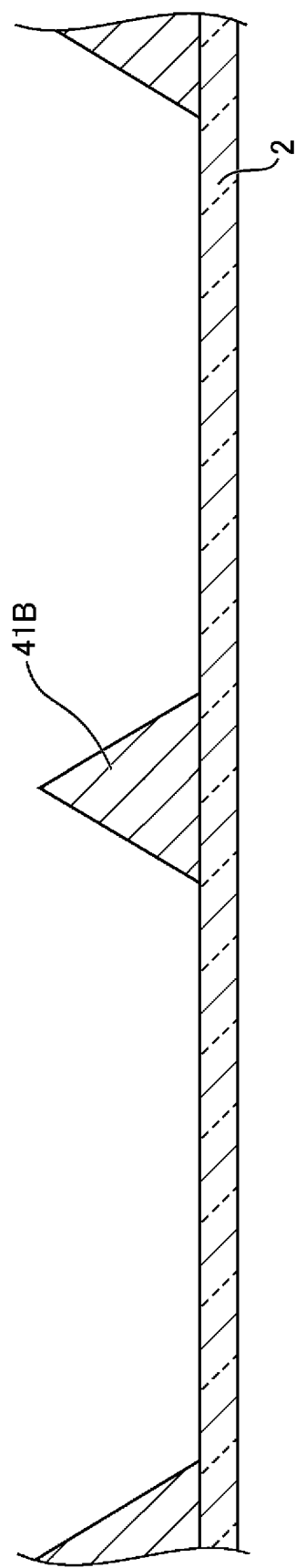
FIG. 11 is a diagram illustrating a process of forming an insulating layer according to the third embodiment.
Figure 12:
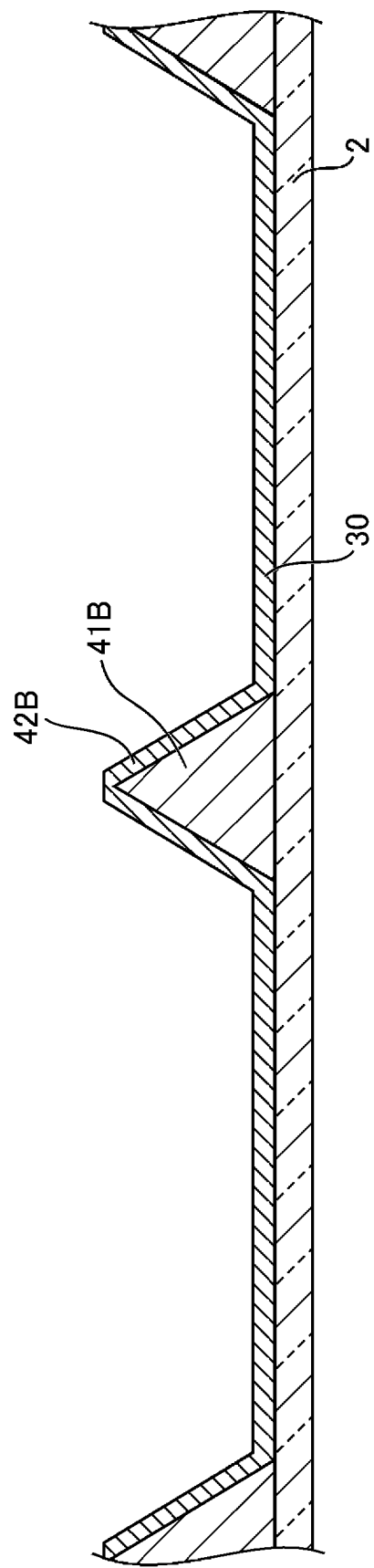
FIG. 12 is a diagram illustrating a process of forming a second reflective layer and a third reflective layer according to the third embodiment.
Figure 13:
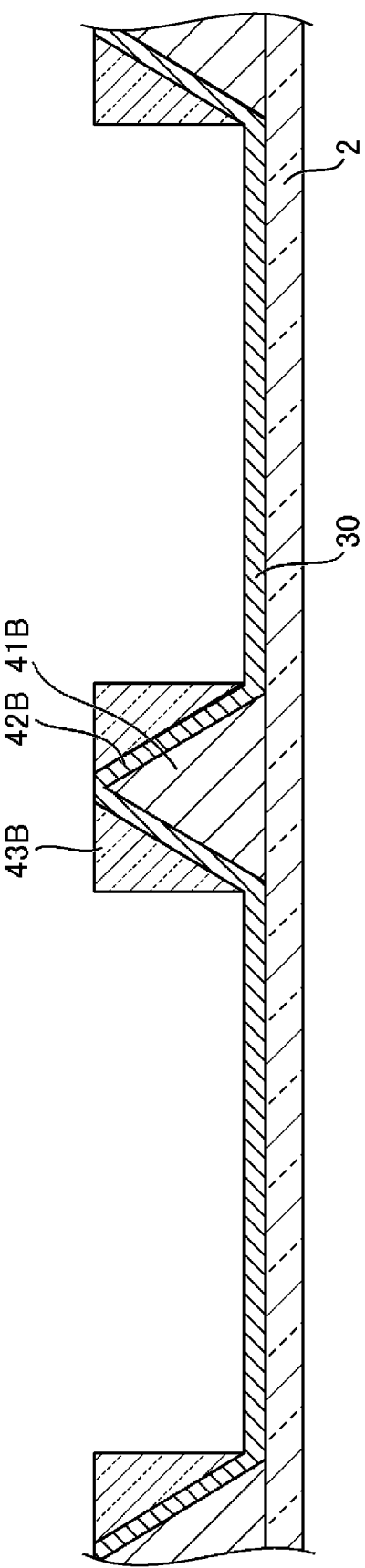
FIG. 13 is a diagram illustrating a process of forming a transmissive portion according to the third embodiment.
Figure 14:
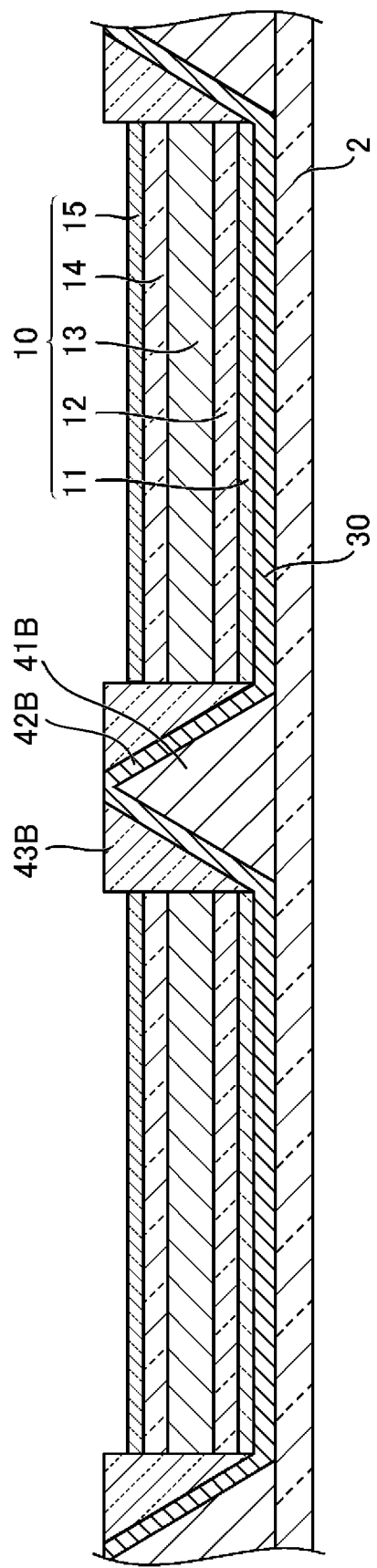
FIG. 14 is a diagram illustrating a process of forming a light-emitting portion according to the third embodiment.
Figure 15:
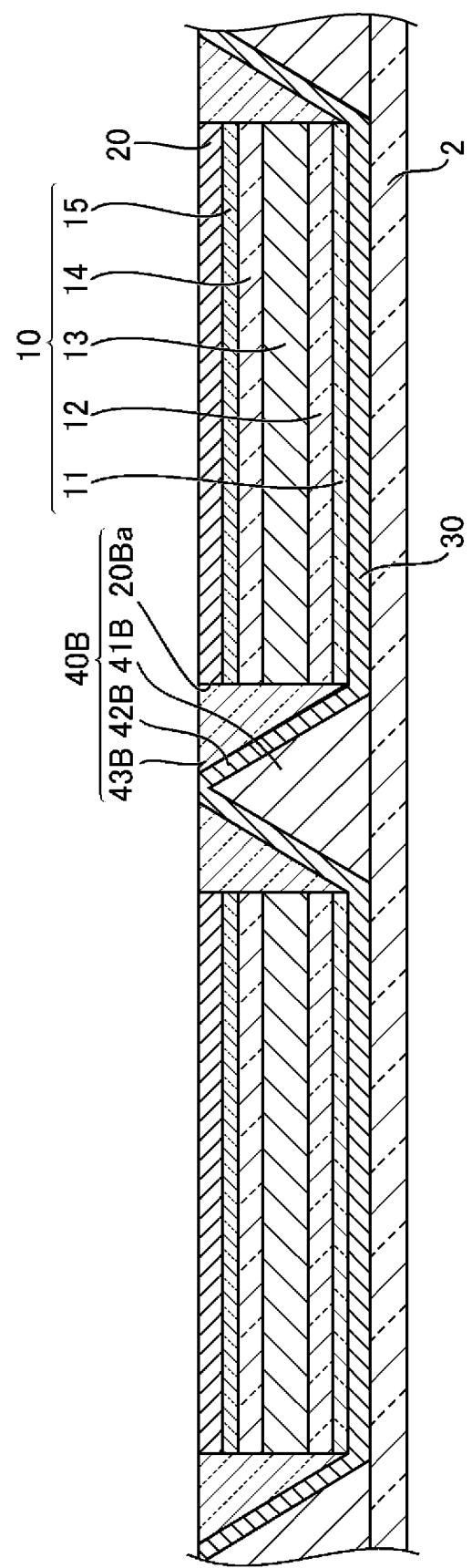
FIG. 15 is a diagram illustrating a process of forming a first reflective layer according to the third embodiment.
Figure 16:
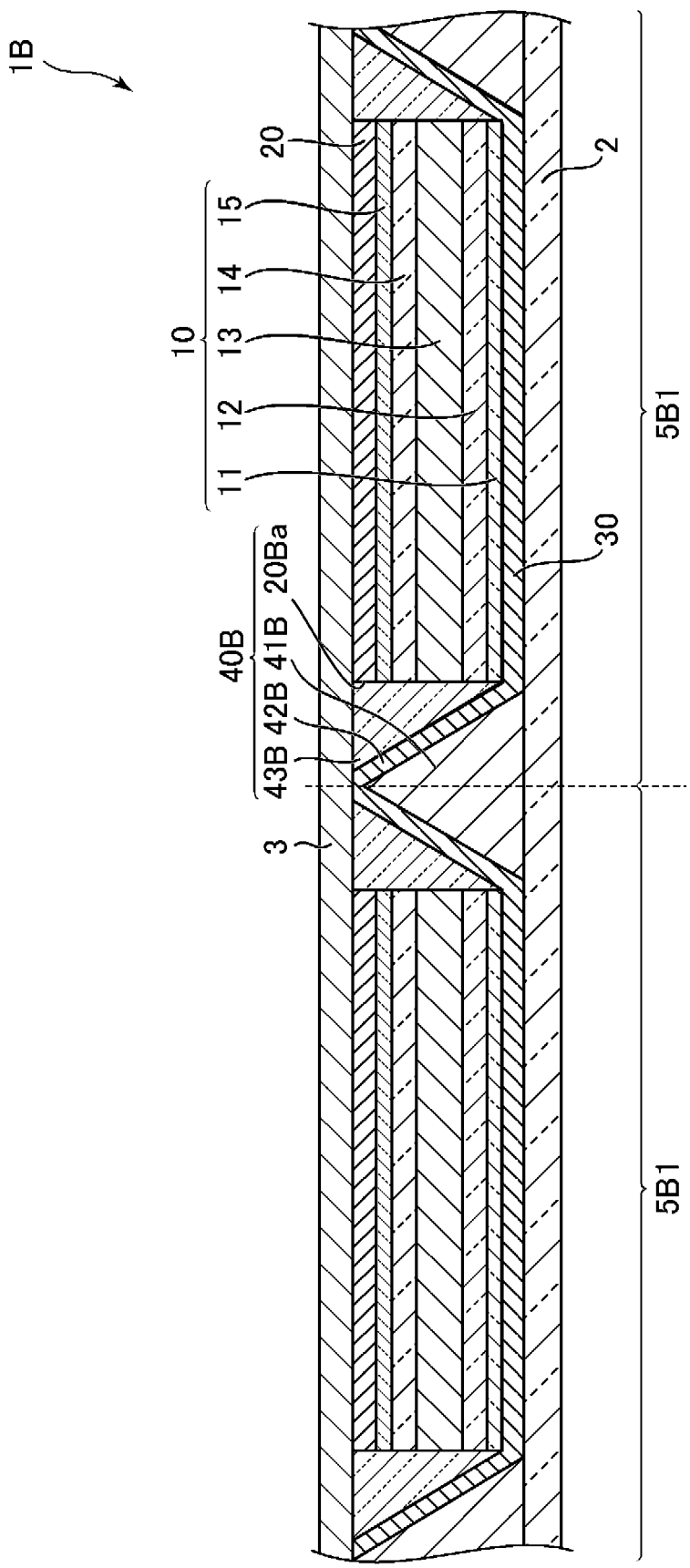
FIG. 16 is a diagram illustrating a process of providing a transparent substrate according to the third embodiment.

With reference to FIGS. 11 to 16, a method for manufacturing the display device 1B will be described. FIG. 11 is a diagram illustrating a process of forming the insulating layer 41B according to the third embodiment. FIG. 12 is a diagram illustrating a process of forming the second reflective layer 42B and the third reflective layer 30 according to the third embodiment. FIG. 13 is a diagram illustrating a process of forming the transmissive portion 43B according to the third embodiment. FIG. 14 is a diagram illustrating a process of forming the light-emitting portion according to the third embodiment. FIG. 15 is a diagram illustrating a process of forming the first reflective layer 20 according to the third embodiment. FIG. 16 is a diagram illustrating a process of providing the transparent substrate 3 according to the third embodiment.

As illustrated in FIG. 11, the insulating layer 41B having a forward tapered shape is formed on the substrate 2 by ashing and dry etching of an insulating material. Next, as illustrated in FIG. 12, the third reflective layer 30 is formed on the substrate 2 and the second reflective layer 42B is formed on the insulating layer 41B by sputtering, vapor deposition, coating, and the like of a metal material. Next, as illustrated in FIG. 13, the transmissive portion 43B is formed on the second reflective layer 42B by ashing, dry etching, and the like of a transparent resin material. Next, as illustrated in FIG. 14, the light guide layer 11, the first electrode 12, the light-emitting layer 13, the second electrode 14, and the light guide layer 15 are layered in this order on the third reflective layer 30. In this way, the light-emitting portion 10 is formed.

Next, as illustrated in FIG. 15, a metal layer is formed on the entire surface of the display region, and the first opening 20Ba is formed in a portion of the formed metal layer that covers the second reflective layer 42B and the transmissive portion 43B. This forms the first reflective layer 20 on the light guide layer 15, and the light-exiting portion 40B adjacent to the light-emitting portion 10. Next, as illustrated in FIG. 16, the transparent substrate 3 is bonded. This completes the light-emitting element 5B1, thereby completing the display device 1B.

Figure 17:
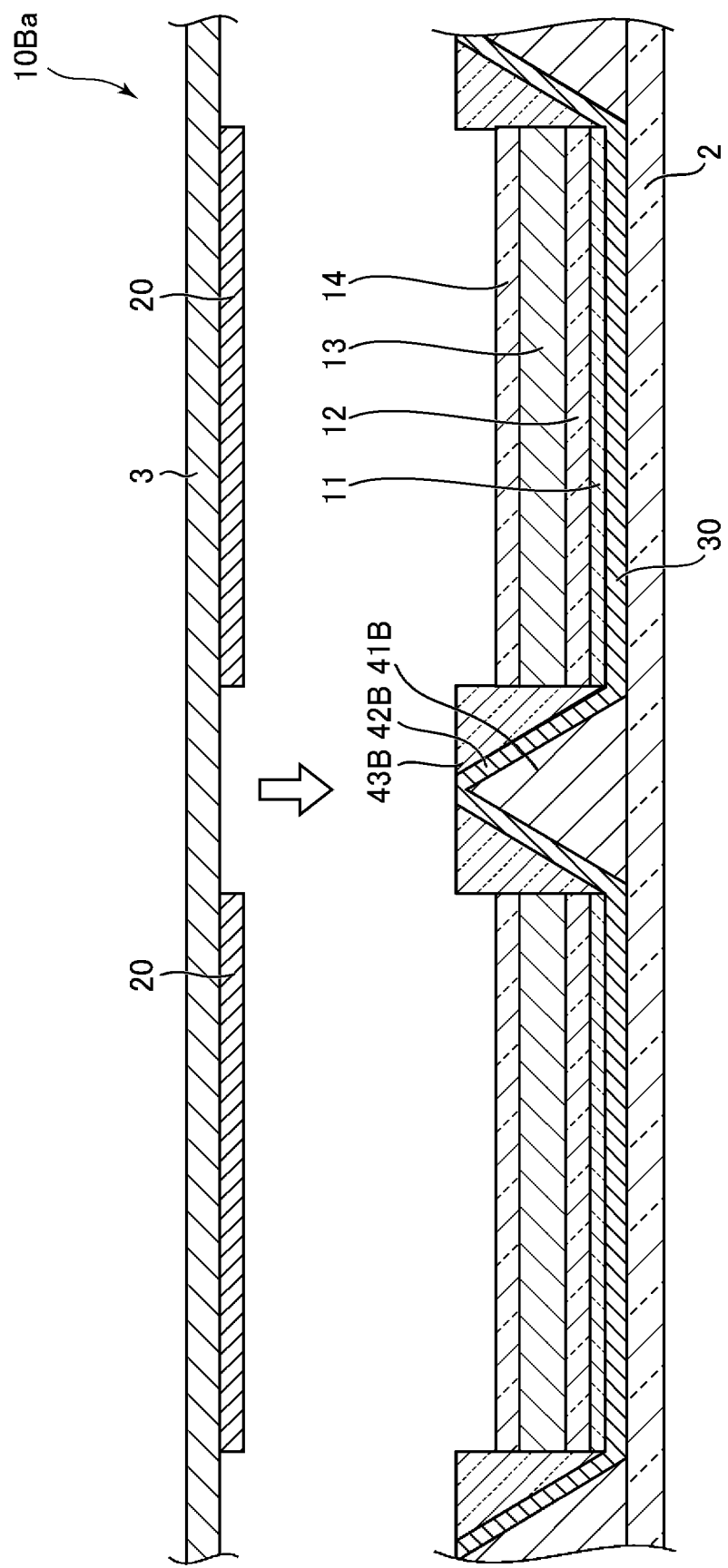
FIG. 17 is a diagram illustrating a process of providing a transparent substrate with a first reflective layer according to a modified example of the third embodiment.
Figure 18:
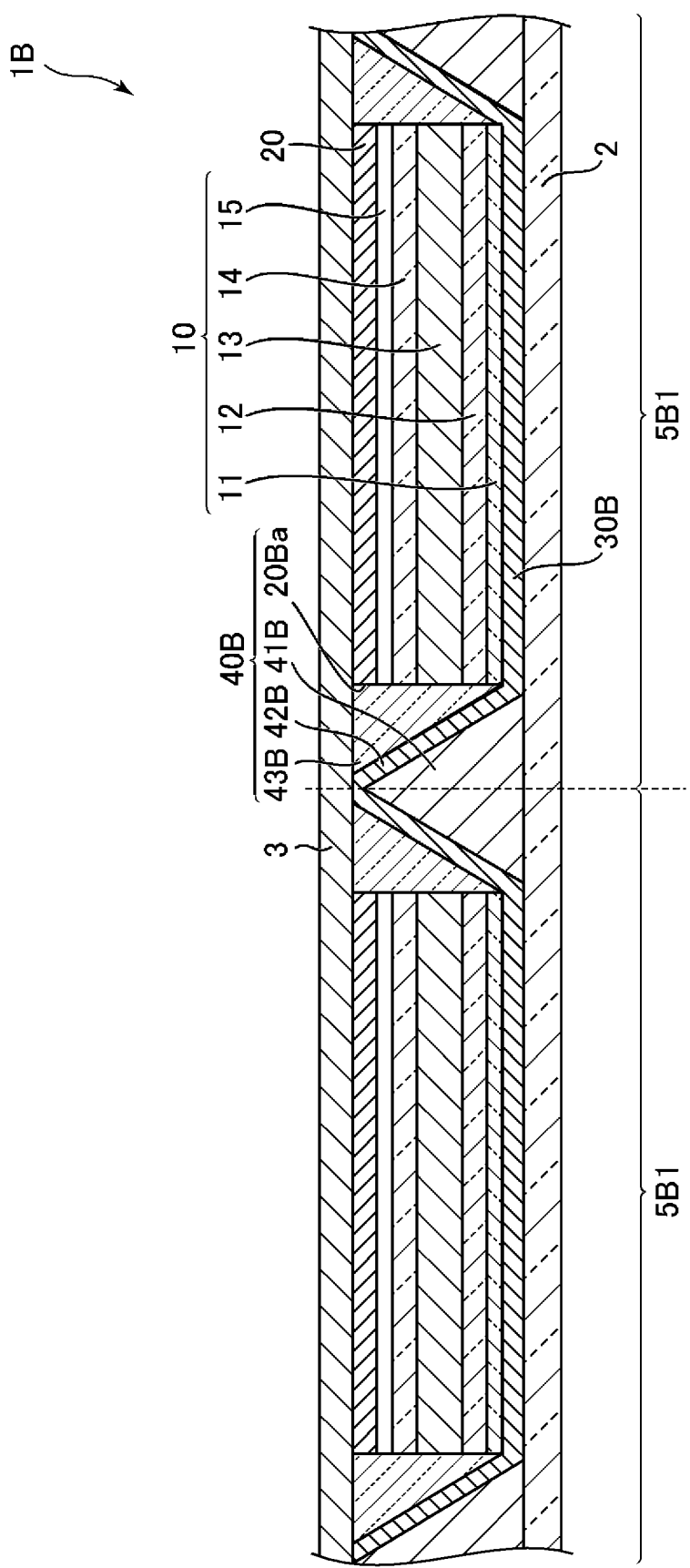
FIG. 18 is a diagram illustrating a state in which a display device according to the modified example of the third embodiment is completed.

With reference to FIGS. 17 and 18, a method for manufacturing the display device 1B according to a modified example of the third embodiment will be described. FIG. 17 is a diagram illustrating a process of providing the transparent substrate 3 with the first reflective layer 20 according to the modified example of the third embodiment. FIG. 18 is a diagram illustrating a state in which the display device 1B according to the modified example of the third embodiment is completed.

As illustrated in FIG. 17, in a case in which the light guide layer 15 is an air layer, the first reflective layer 20 is pattern-formed in advance on the transparent substrate 3. Then, the transparent substrate 3 with the first reflective layer 20 is bonded to the substrate in which layers until the second electrode 14 are formed on the substrate 2. As a result, as illustrated in FIG. 18, the light-emitting element 5B1 in which the light guide layer 15 composed of air being a gap between the second electrode 14 and the first reflective layer 20 is formed is completed, whereby the display device 1B is completed.

Fourth Embodiment

Figure 19:
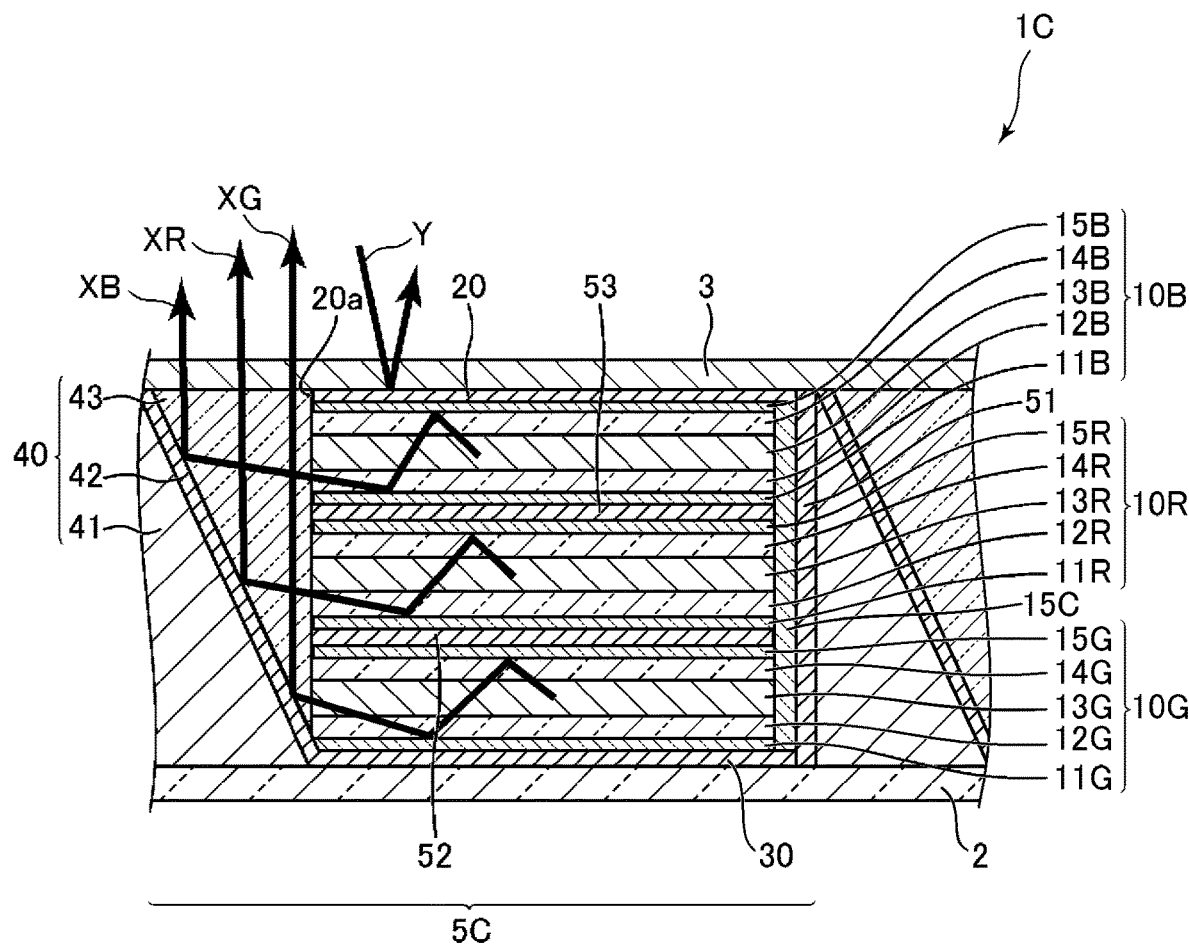
FIG. 19 is a cross-sectional view illustrating an example of a configuration of a light-emitting element of a display device according to a fourth embodiment.

FIG. 19 is a cross-sectional view illustrating an example of a configuration of a light-emitting element 5C of a display device 1C according to a fourth embodiment. The display device 1C includes the light-emitting element 5C in place of the light-emitting element 5 included in the display device 1 (FIG. 2). The light-emitting element 5C includes light-emitting portions 10G, 10R, and 10B in place of the light-emitting portion 10 included in the light-emitting element 5 (FIG. 2), and further includes reflective layers 51, 52, and 53, and a light guide layer 15C.

Adjacently to the light-exiting portion 40, the light-emitting portion 10G is provided on the substrate 2, the reflective layer 52 is provided on the light-emitting portion 10G, the light-emitting portion 10R is provided on the reflective layer 52, the reflective layer 53 is provided on the light-emitting portion 10R, the light-emitting portion 10B is provided on the reflective layer 53, and the first reflective layer 20 is provided on the light-emitting portion 10B.

The light-emitting portion 10G emits light XG and the emitted light XG is reflected by the reflective layer 52 provided in an upper layer and the third reflective layer 30 provided in a lower layer to be guided to the adjacent light-exiting portion 40. The light-emitting portion 10G includes a light guide layer (first light guide layer) 11G, a first electrode 12G, a light-emitting layer (first light-emitting layer) 13G, a second electrode 14G, and a light guide layer (first light guide layer) 15G, which are layered in this order. One of the first electrode 12G and the second electrode 14G functions as an anode electrode for causing the light-emitting portion 10G to emit the light XG, and the other functions as a cathode electrode.

The light-emitting layer 13G is provided overlapping with the light-emitting layer 13R and the light-emitting layer 13B in a plan view, and emits the light XG different from light XR emitted by the light-emitting layer 13R and light XB emitted by the light-emitting layer 13B. In the present embodiment, the light-emitting layer 13G is provided in a lower layer underlying the light-emitting layer 13R and the light-emitting layer 13B.

The light guide layer 11G is provided between the light-emitting layer 13G and the third reflective layer 30. The light guide layer 15G is provided between the light-emitting layer 13G and the light-emitting layer 13R, in other words, between the light-emitting layer 13G and the reflective layer 52. The light guide layers 11G and 15G are layers that guide the light XG emitted by the light-emitting layer 13G to the light-exiting portion 40.

The light-emitting portion 10R emits light XR and the emitted light XR is reflected by the reflective layer 53 provided in an upper layer and the reflective layer 52 provided in a lower layer to be guided to the adjacent light-exiting portion 40. The light-emitting portion 10R includes a light guide layer 11R, a first electrode 12R, a light-emitting layer (second light-emitting layer) 13R, a second electrode 14R, and a light guide layer (second light guide layer) 15R, which are layered in this order. One of the first electrode 12R and the second electrode 14R functions as an anode electrode for causing the light-emitting portion 10R to emit the light XR, and the other functions as a cathode electrode.

The light-emitting layer 13R is provided overlapping with the light-emitting layer 13G and the light-emitting layer 13B in a plan view, and emits the light XR different from the light XG emitted by the light-emitting layer 13G and light XB emitted by the light-emitting layer 13B. In the present embodiment, the light-emitting layer 13R is provided in an upper layer overlying the light-emitting layer 13G and in a lower layer underlying the light-emitting layer 13B.

The light guide layer 11R is provided between the light-emitting layer 13R and the light-emitting layer 13G, in other words, between the light-emitting layer 13R and the reflective layer 52. The light guide layer 15R is provided between the light-emitting layer 13R and the light-emitting layer 13B, in other words, between the light-emitting layer 13R and the reflective layer 53. The light guide layers 11R and 15R are layers that guide the light XR emitted by the light-emitting layer 13R to the light-exiting portion 40.

The light-emitting portion 10B emits the light XB and the emitted light XB is reflected by the first reflective layer 20 provided in an upper layer and the reflective layer 53 provided in a lower layer to be guided to the adjacent light-exiting portion 40. The light-emitting portion 10B includes a light guide layer (second light guide layer) 11B, a first electrode 12B, a light-emitting layer (third light-emitting layer) 13B, a second electrode 14B, and a light guide layer 15B, which are layered in this order. One of the first electrode 12B and the second electrode 14B functions as an anode electrode for causing the light-emitting portion 10B to emit the light XB, and the other functions as a cathode electrode.

The light-emitting layer 13B is provided overlapping with the light-emitting layer 13G and the light-emitting layer 13R in a plan view, and emits the light XB different from the light XG emitted by the light-emitting layer 13G and the light XR emitted by the light-emitting layer 13R. In the present embodiment, the light-emitting layer 13B is provided in an upper layer overlying the light-emitting layer 13G and the light-emitting layer 13R.

The light guide layer 11B is provided between the light-emitting layer 13B and the light-emitting layer 13R, in other words, between the light-emitting layer 13B and the reflective layer 53. The light guide layer 15B is provided between the light-emitting layer 13B and the first reflective layer 20. The light guide layers 11B and 15B are layers that guide the light XB emitted by the light-emitting layer 13B to the light-exiting portion 40.

The light guide layer 15C covers an end portion of each of the light-emitting portions 10G, 10R, and 10B on a side close to another light-emitting element adjacent to the light-emitting element 5C in the layering direction, so as to connect the light guide layer 11G layer and the light guide layer 15B.

The reflective layer 51 covers an end portion of each of the light-emitting portions 10G, 10R, and 10 on a side close to another light-emitting element adjacent to the light-emitting element 5C with the light guide layer 15C interposed therebetween in the layering direction, so as to connect the first reflective layer 20 and the third reflective layer 30, and the light guide layer 11G and the light guide layer 15B.

The light guide layers 11G, 11R, and 11B and the light guide layers 15G, 15R, 15B, and 15C are formed of the same material as that of the light guide layers 11 and 15 (FIG. 2), the first electrodes 12G, 12R, and 12B are formed of the same material as that of the first electrode 12 (FIG. 2), the second electrodes 14G, 14R, and 14B are formed of the same material as that of the second electrode 14 (FIG. 2), and the reflective layers 51, 52, and 53 are formed of the same material as that of the first reflective layer 20 and the third reflective layer 30. The light-emitting portions 10G, 10R, and 10B can individually control light emission. Note that the layering order of the light-emitting portions 10G, 10R, and 10B can be arbitrarily changed.

When the light-emitting portions 10G, 10R, and 10B are layered in this manner, it is possible to increase the density of pixels.

Figure 20:
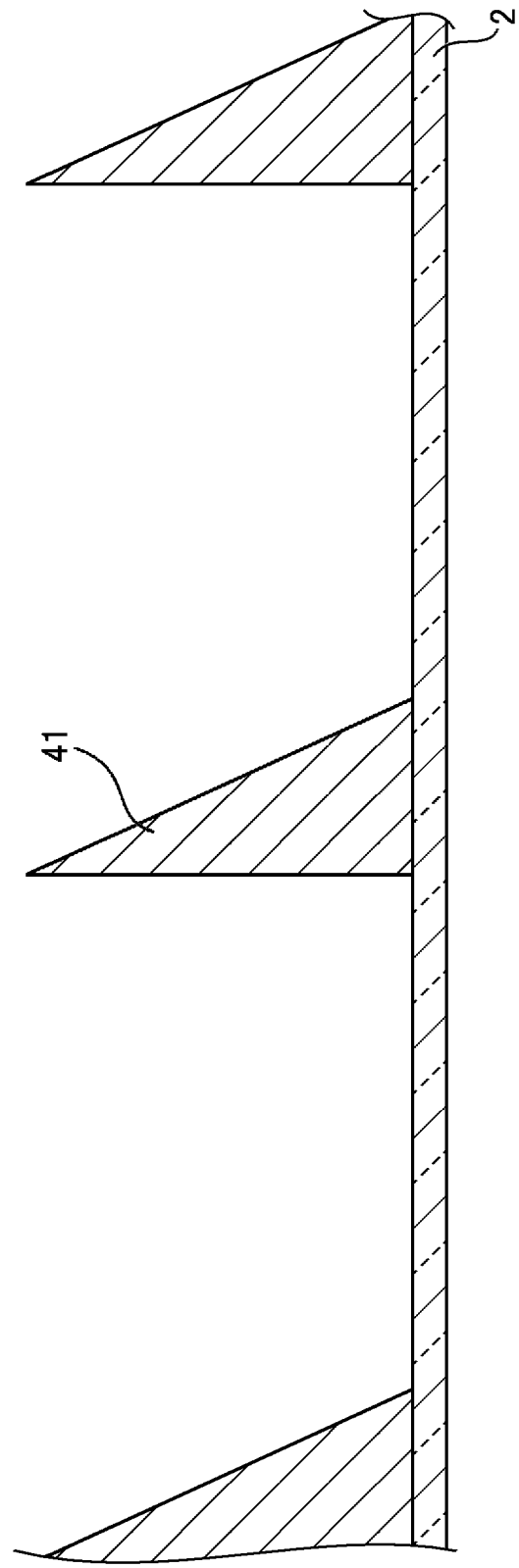
FIG. 20 is a diagram illustrating a process of forming an insulating layer according to the fourth embodiment.
Figure 21:
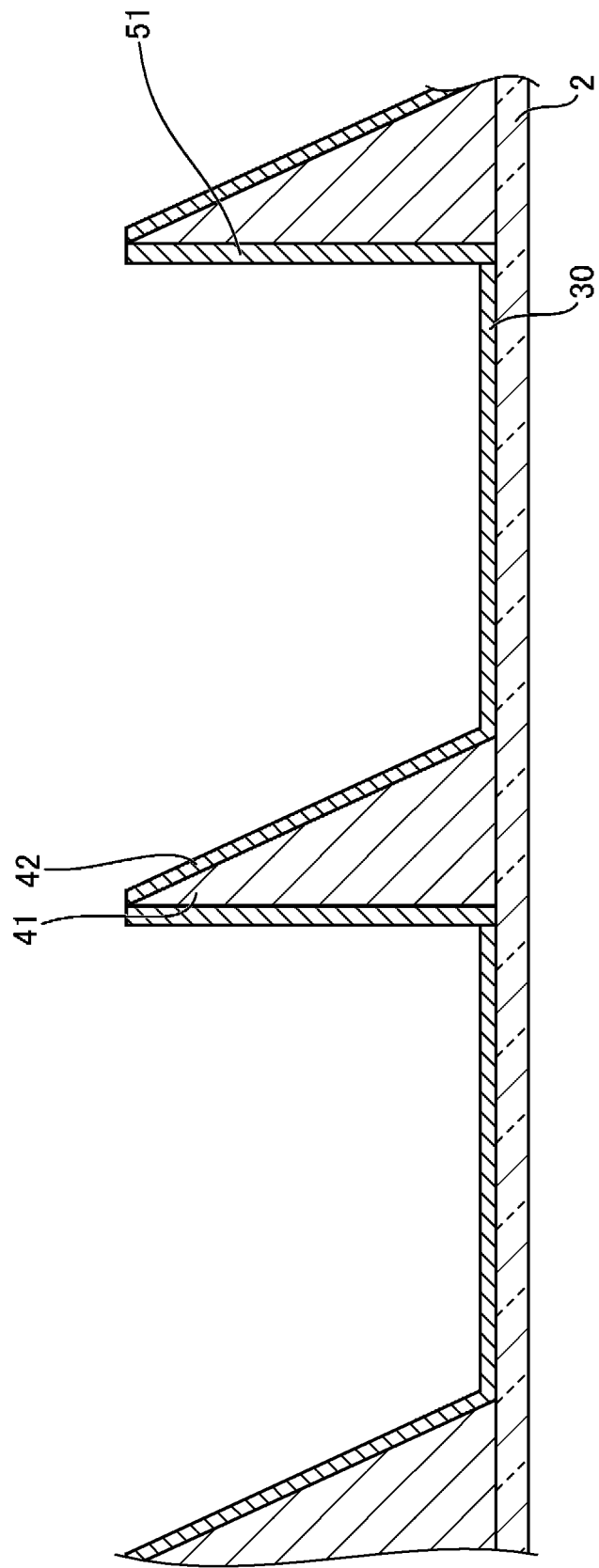
FIG. 21 is a diagram illustrating a process of forming a second reflective layer and a third reflective layer according to the fourth embodiment.
Figure 22:
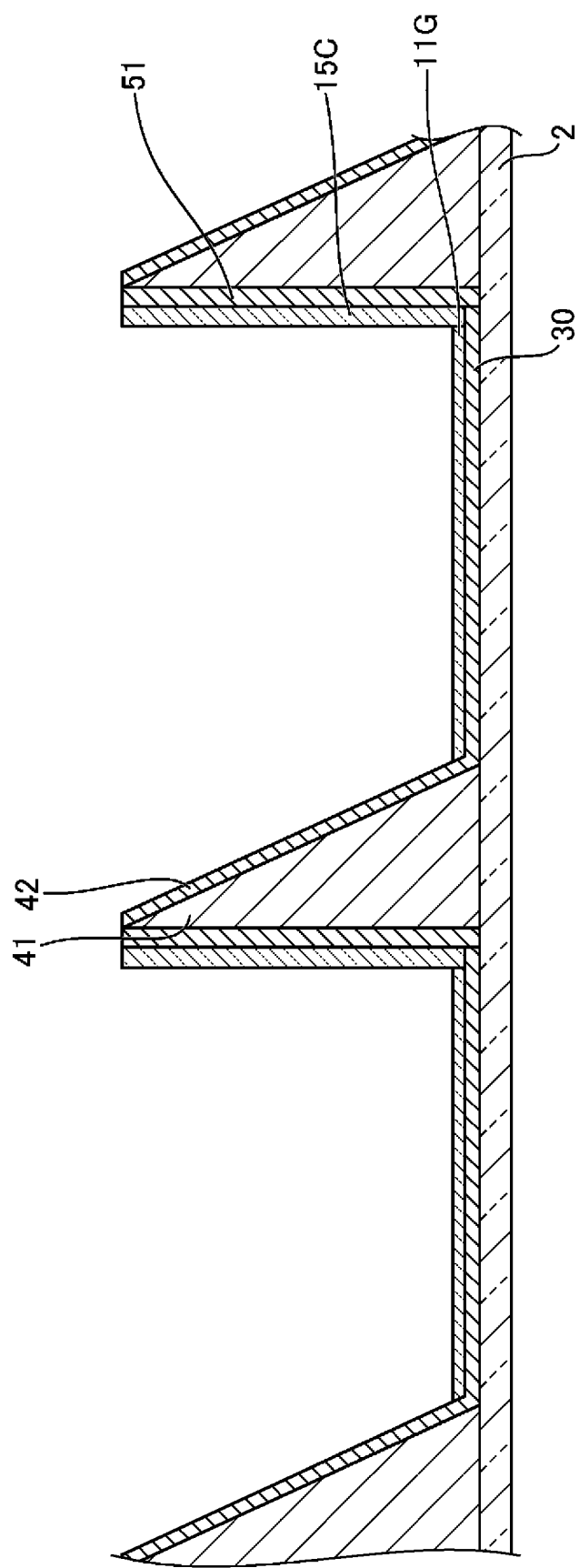
FIG. 22 is a diagram illustrating a process of forming a light guide layer according to the fourth embodiment.
Figure 23:
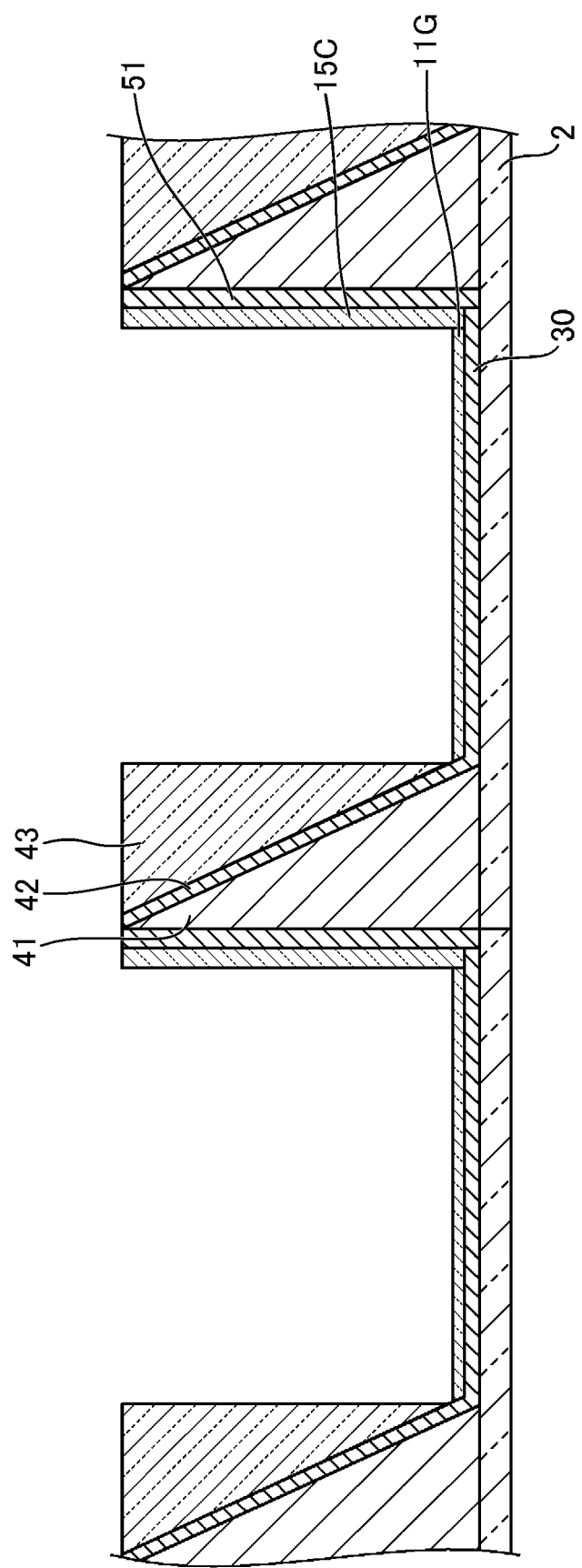
FIG. 23 is a diagram illustrating a process of forming a transmissive portion according to the fourth embodiment.
Figure 24:
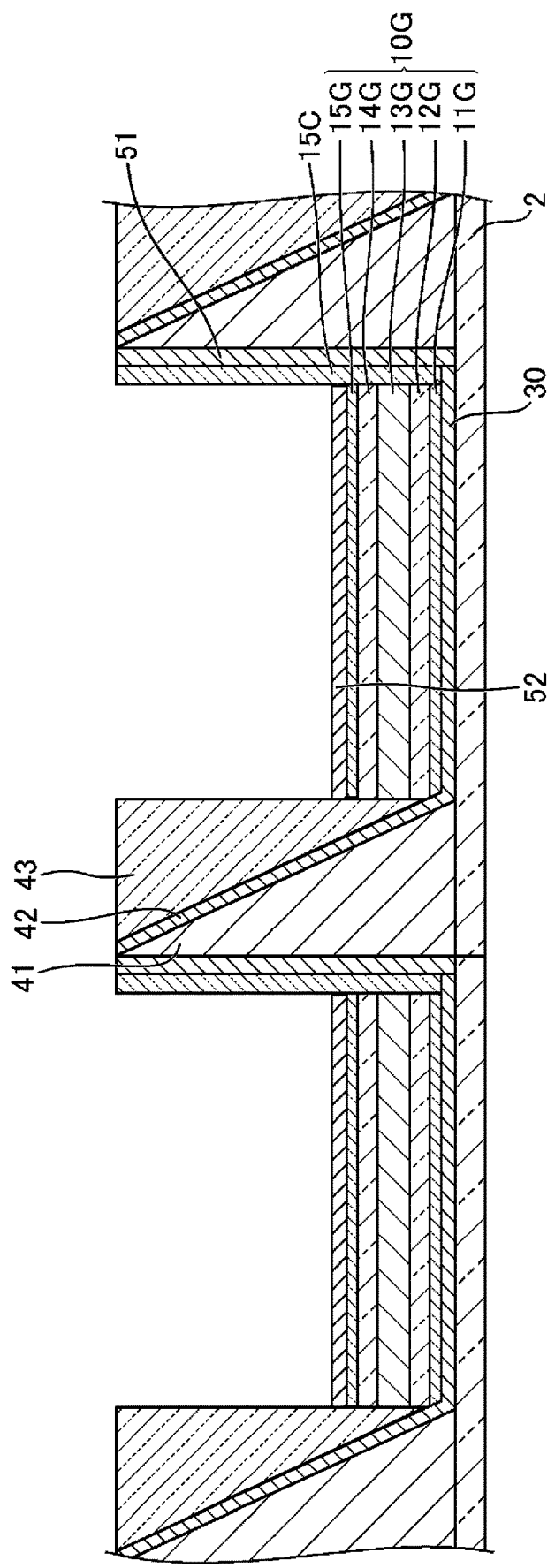
FIG. 24 is a diagram illustrating a process of forming a light-emitting portion and a reflective layer according to the fourth embodiment.
Figure 25:
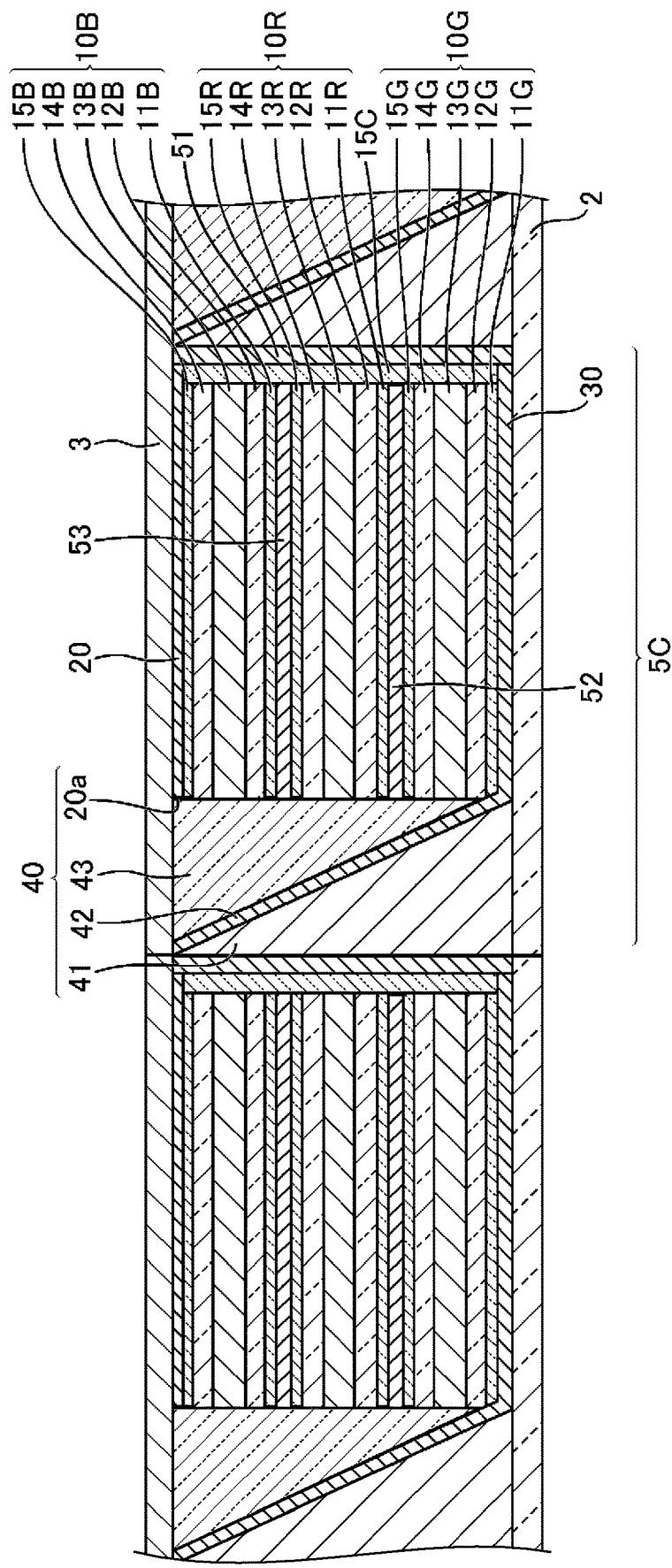
FIG. 25 is a diagram illustrating a process until the light-emitting element according to the fourth embodiment is completed.

With reference to FIGS. 20 to 25, a method for manufacturing the display device 1C will be described. FIG. 20 is a diagram illustrating a process of forming the insulating layer 41 according to the fourth embodiment. FIG. 21 is a diagram illustrating a process of forming the second reflective layer 42B and the third reflective layer 30 according to the fourth embodiment. FIG. 22 is a diagram illustrating a process of forming the light guide layer 11G according to the fourth embodiment. FIG. 23 is a diagram illustrating a process of forming the transmissive portion 43 according to the fourth embodiment. FIG. 24 is a diagram illustrating a process of forming the light-emitting portion 10G and the reflective layer 52 according to the fourth embodiment. FIG. 25 is a diagram illustrating a process until the light-emitting element 5C according to the fourth embodiment is completed.

As illustrated in FIG. 20, the insulating layer 41 having a forward tapered shape is formed on the substrate 2 by ashing and dry etching of an insulating material. Next, as illustrated in FIG. 21, the third reflective layer 30 is formed on the substrate 2, the second reflective layer 42 is formed on one side surface of the insulating layer 41, and the reflective layer 51 is formed on the other side surface of the insulating layer 41 by sputtering, vapor deposition, coating, or the like of a metal material. Next, as illustrated in FIG. 22, the light guide layer 11G is formed on the third reflective layer 30 and the light guide layer 15C is formed on the reflective layer 51 by ashing, dry etching, and the like of a transparent resin material. Next, as illustrated in FIG. 23, the transmissive portion 43 is formed on the second reflective layer 42 by ashing, dry etching, and the like of a transparent resin material. Next, as illustrated in FIG. 24, on the light guide layer 11G, the first electrode 12G, the light-emitting layer 13G, the second electrode 14G, and the reflective layer 52 are layered in this order. In this manner, the light-emitting portion 10G is formed.

Next, as illustrated in FIG. 25, the light guide layer 11R, the first electrode 12R, the light-emitting layer 13R, and the second electrode 14R are layered in this order on the reflective layer 52 to form the light-emitting portion 10R. Further, the reflective layer 51, the light guide layer 11B, the first electrode 12B, the light-emitting layer 13B, and the second electrode 14B are layered in this order to form the light-emitting portion 10B. Further, a metal layer is formed on the entire surface of the display region, and the first opening 20a is formed in a portion of the formed metal layer, which covers the second reflective layer 42 and the transmissive portion 43. In this manner, the first reflective layer 20 is formed on the light guide layer 15B, and the light-exiting portion 40 adjacent to the light-emitting portions 10G, 10R, and 10B is formed. Then, the transparent substrate 3 is bonded. This completes the light-emitting element 5C, thereby completing the display device 1C.

The disclosure is not limited to the embodiments described above, and embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. A display device comprising:
  a substrate; and
  a light-emitting element provided on the substrate and including a light-emitting portion, a first reflective layer overlapping with the light-emitting portion and configured to reflect external light, and a light-exiting portion adjacent to the light-emitting portion,
  wherein the light-emitting portion includes a first electrode, a first light-emitting layer, and a second electrode provided in this order from the substrate side to the first reflective layer side, and the light-exiting portion includes a first opening, the first opening being an opening of the first reflective layer, and a second reflective layer configured to reflect light from the light-emitting portion to the first opening.

2. The display device according to claim 1, wherein the second reflective layer is inclined relative to the substrate.

3. The display device according to claim 1, wherein the light-emitting portion is provided at least between the substrate and the first electrode, between the first electrode and the first light-emitting layer, between the first light-emitting layer and the second electrode, or between the second electrode and the first reflective layer, and includes a first light guide layer configured to guide light from the first light-emitting layer to the light-exiting portion.

4. The display device according to claim 3, wherein the first light guide layer is provided at least between the first electrode and the first light-emitting layer or between the first light-emitting layer and the second electrode, and has conductivity.

5. The display device according to claim 3, wherein the first light guide layer has a refractive index lower than a refractive index of the first light-emitting layer.

6. The display device according to claim 3, wherein the first light guide layer includes a plurality of layers layered in order,
the plurality of layers have a refractive index that decreases in order from a layer closest to the first light-emitting layer to a layer farthest from the first light-emitting layer, and
of the plurality of layers, the layer closest to the first light-emitting layer has a refractive index equal to or lower than a refractive index of the first light-emitting layer.

7. The display device according to claim 1, further comprising
a third reflective layer provided between the substrate and the first electrode and configured to reflect light from the first light-emitting layer.

8. The display device according to claim 1, wherein at least one of the first electrode and the second electrode is formed into an island shape,
the display device further includes a partition wall portion including the light-exiting portion and formed into a frame shape overlapping with an edge of one electrode of the first electrode and the second electrode, the one electrode being formed into an island shape,
the first light-emitting layer has a light-emitting region, the light-emitting region being an inner region surrounded by the partition wall portion, in a plan view, and
the first opening is provided along at least one side of the light-emitting region, in a plan view.

9. The display device according to claim 8, wherein the light-emitting region has a first side, and a second side and a third side adjacent to the first side in a plan view,
the first opening is provided along the first side, and an angle formed by the first side and the second side and an angle formed by the first side and the third side are each smaller than 90 degrees.

10. The display device according to claim 7, wherein the third reflective layer has a plurality of first irregular portions provided on a surface facing the first electrode.

11. The display device according to claim 1, wherein the light-exiting portion further includes a transmissive portion provided on the second reflective layer, transmitting light reflected by the second reflective layer, and including a plurality of second irregular portions provided on a surface overlapping with the first opening in a plan view.

12. The display device according to claim 7, wherein the third reflective layer includes a plurality of first irregular portions provided on a surface facing the first electrode,
the light-exiting portion further includes a transmissive portion provided on the second reflective layer, transmitting light reflected by the second reflective layer, and including a plurality of second irregular portions provided on a surface overlapping with the first opening in a plan view, and
a distance between adjacent convex portions in the plurality of first irregular portions is larger than a distance between adjacent convex portions in the plurality of second irregular portions.

13. The display device according to claim 12, wherein the distance between adjacent convex portions in the plurality of second irregular portions is equal to or smaller than a wavelength of light from the first light-emitting layer.

14. The display device according to claim 8, wherein the first opening surrounds the light-emitting region in a plan view.

15. The display device according to claim 1, further comprising:
a second light-emitting layer provided overlapping with the first light-emitting layer in a plan view and configured to emit light of a second color different from light of a first color emitted by the first light-emitting layer; and
a third light-emitting layer provided overlapping with the first light-emitting layer and the second light-emitting layer in a plan view and configured to emit light of a third color different from the light of the first color and the light of the second color.

16. The display device according to claim 15, further comprising
a second light guide layer provided between the second light-emitting layer and the third light-emitting layer and configured to guide at least one of the light of the second color and the light of the third color to the light-exiting portion.

17. The display device according to claim 1, wherein a surface of the first reflective layer is a mirror surface.

* * * * *